(12) United States Patent
Watanabe et al.

(10) Patent No.: US 7,218,185 B2
(45) Date of Patent: May 15, 2007

(54) IMPEDANCE CIRCUIT, AND FILTER CIRCUIT, AMPLIFIER CIRCUIT, SEMICONDUCTOR INTEGRATED CIRCUIT, ELECTRONIC COMPONENT, AND WIRELESS COMMUNICATIONS DEVICE USING THE SAME

(75) Inventors: Toru Watanabe, Nagano-ken (JP); Makoto Inoguchi, Nishitokyo (JP)

(73) Assignee: Seiko Epson Corporation (JP)

( * ) Notice: Subject to any disclaimer, the term of this patent is extended or adjusted under 35 U.S.C. 154(b) by 19 days.

(21) Appl. No.: 10/944,693

(22) Filed: Sep. 17, 2004

(65) Prior Publication Data

US 2005/0093645 A1 May 5, 2005

(30) Foreign Application Priority Data

| Sep. 24, 2003 | (JP) | ............................. 2003-331598 |
| Sep. 24, 2003 | (JP) | ............................. 2003-331599 |
| Apr. 28, 2004 | (JP) | ............................. 2004-133684 |

(51) Int. Cl.
*H01P 1/10* (2006.01)
*H03H 7/38* (2006.01)

(52) U.S. Cl. ...................................... 333/103; 333/124
(58) Field of Classification Search ................ 333/101, 333/103, 104, 124, 262, 32
See application file for complete search history.

(56) References Cited

U.S. PATENT DOCUMENTS

| 4,095,198 | A | 6/1978 | Kirby ........................... 333/32 |
| 5,274,343 | A * | 12/1993 | Russell et al. .............. 333/103 |
| 5,625,894 | A | 4/1997 | Jou |
| 5,742,215 | A | 4/1998 | Park |
| 5,754,082 | A * | 5/1998 | Swanson ..................... 333/124 |
| 6,195,536 | B1 | 2/2001 | Peckham et al. |
| 7,057,472 | B2 * | 6/2006 | Fukamachi et al. ......... 333/101 |
| 2003/0090339 | A1 | 5/2003 | Yu et al. |

FOREIGN PATENT DOCUMENTS

DE        198 16 490 A1      4/1998

(Continued)

OTHER PUBLICATIONS

Communication from European Patent Office re: related application.

(Continued)

*Primary Examiner*—Dean Takaoka
(74) *Attorney, Agent, or Firm*—Harness, Dickey & Pierce, P.L.C.

(57) ABSTRACT

A filter circuit is provided wherein one end of an inductor is connected to one end of a capacitor to form a signal input end. The other end of the inductor is connected to a first switch circuit, and the other end of the capacitor is connected to a second switch circuit. When a lower-frequency signal in a 2.4 GHz band is to be inputted, a low-pass filter circuit is formed by connecting the other end of the inductor to a signal output end and the other end of the capacitor to ground, and when a higher-frequency signal in a 5 GHz band is to be inputted, a high-pass filter circuit is formed by connecting the other end of the inductor to ground and the other end of the capacitor to the signal output end, by manipulating the first and second switch circuits.

13 Claims, 18 Drawing Sheets

FOREIGN PATENT DOCUMENTS

| | | |
|---|---|---|
| EP | 0 849 820 A2 | 6/1998 |
| EP | 0 993 120 A2 | 4/2000 |
| EP | 1 035 657 A1 | 9/2000 |
| EP | 1187357 A1 * | 3/2002 |
| EP | 0 993 120 A3 | 7/2003 |
| JP | 56103514 | 8/1981 |
| JP | 56-110438 | 9/1981 |
| JP | 60136408 | 7/1985 |
| JP | 05-037255 | 2/1993 |
| JP | 07-321586 | 8/1995 |
| JP | 2001-111373 | 4/2001 |
| JP | 2001111373 | 4/2001 |
| JP | 2003-51758 | 2/2003 |
| WO | WO 03/015301 A1 * | 2/2003 |

OTHER PUBLICATIONS

Patent Abstracts of Japan re: publication No. 05299995.
Patent Abstracts of Japan re: publication No. 56103514.
Patent Abstracts of Japan re: publication No. 60136408.
Adame, P. et al, "A novel RF front-end chipset for ISM band wireless applications", VLSI Design, 2003. Proceedings. 16th Int'l Conference, Jan. 2003, pp. 36-41.
Patent Abstracts of Japan re: publication No. 02151113.

* cited by examiner

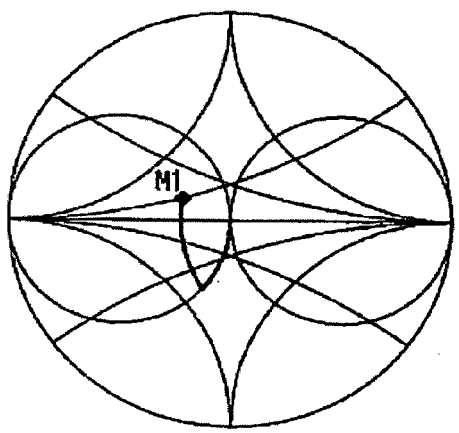
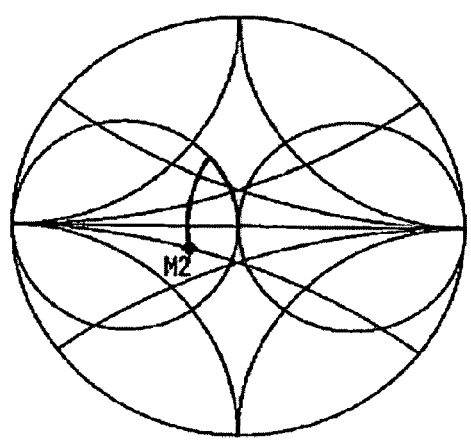
FIG. 12A  FIG. 12B
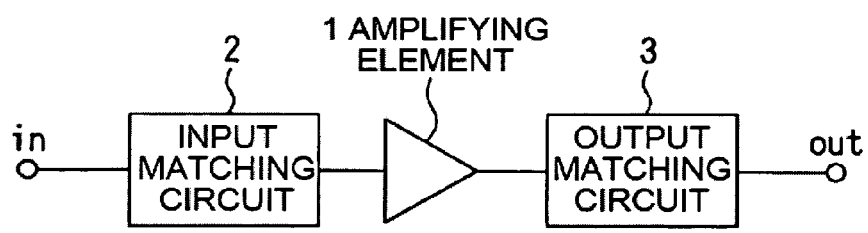
FIG. 13

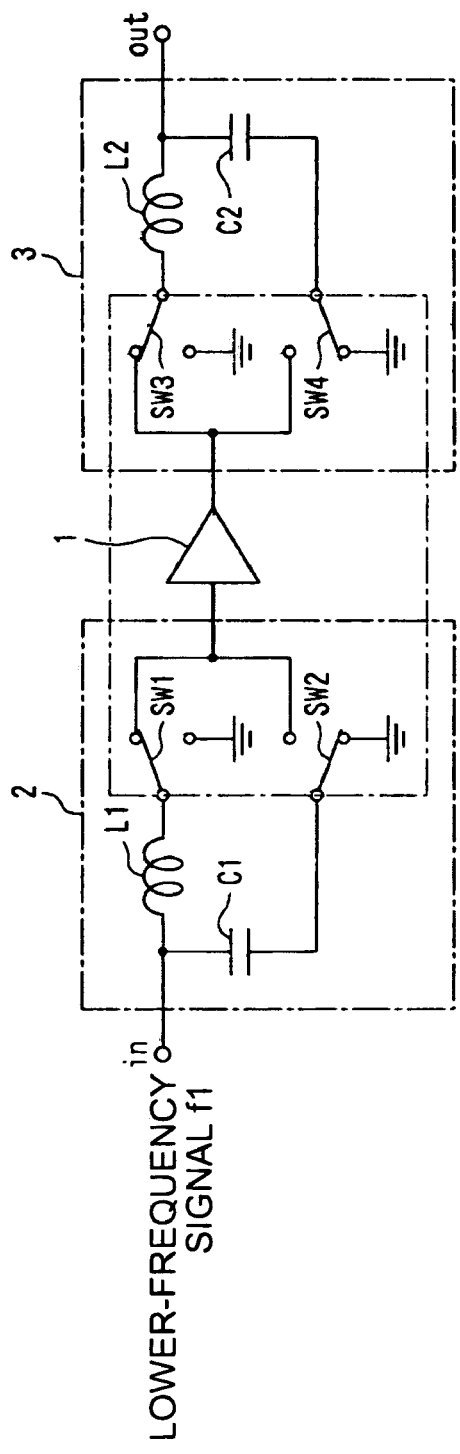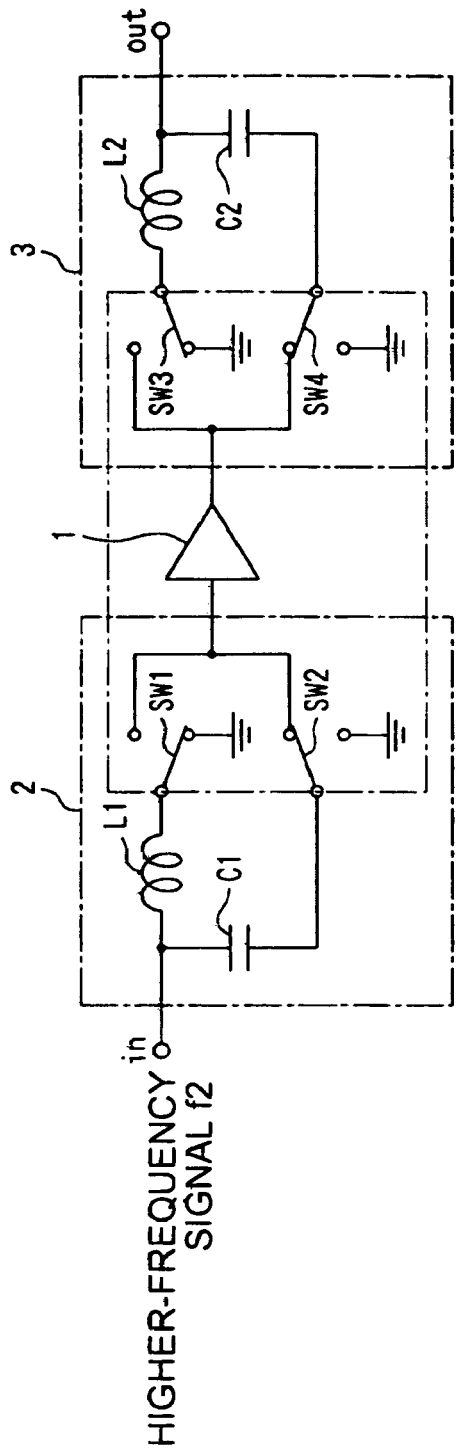
FIG. 14A
FIG. 14B

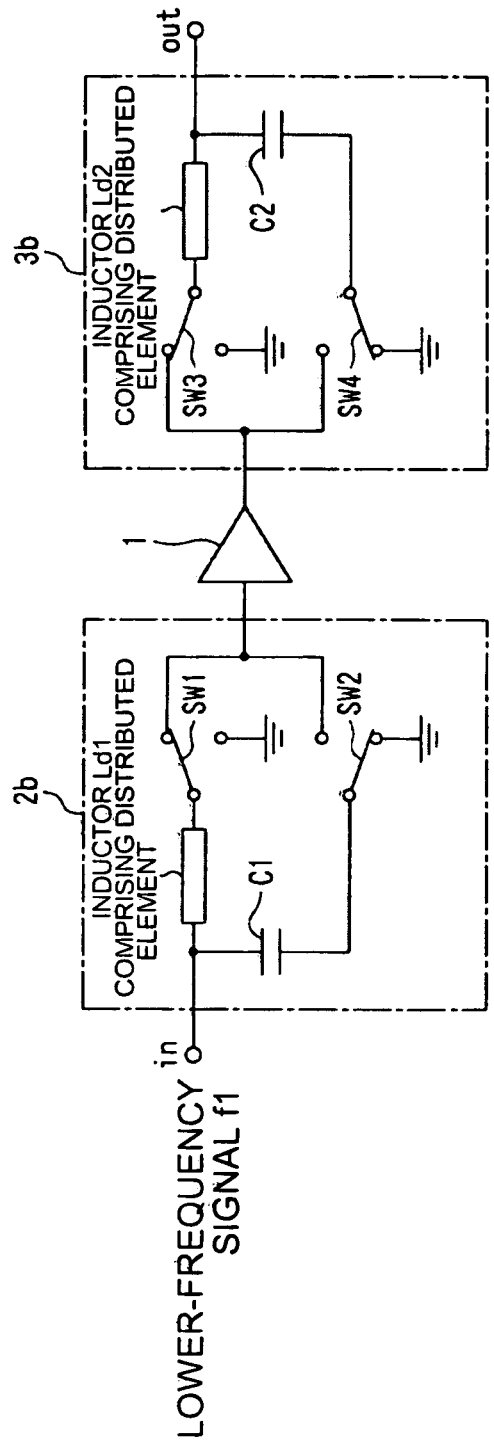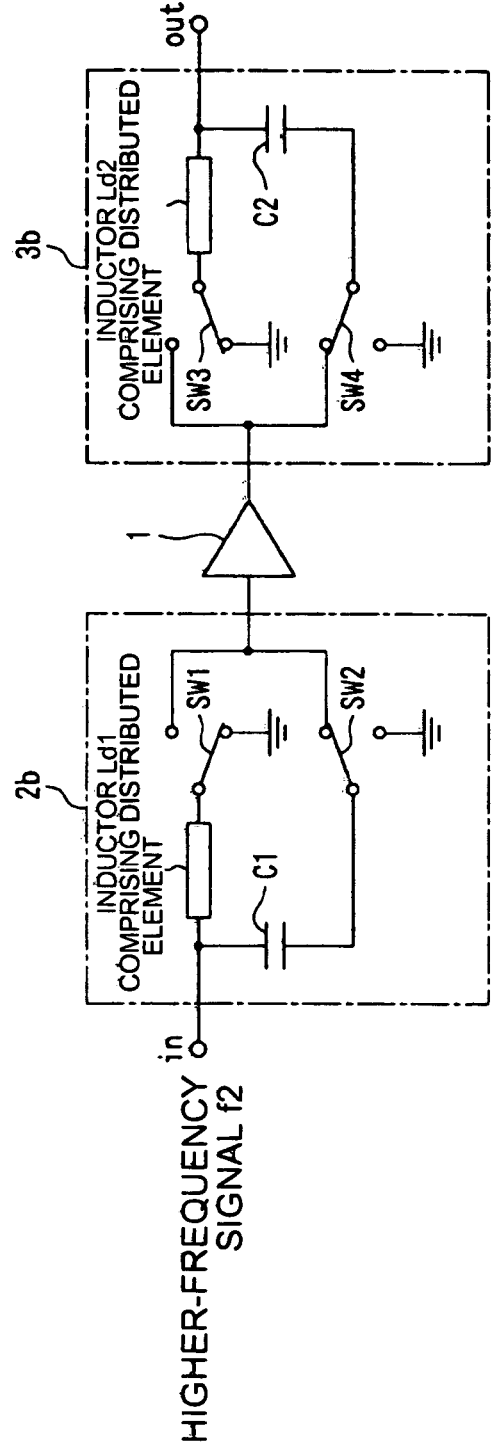
FIG. 16A
FIG. 16B

IMPEDANCE CIRCUIT, AND FILTER CIRCUIT, AMPLIFIER CIRCUIT, SEMICONDUCTOR INTEGRATED CIRCUIT, ELECTRONIC COMPONENT, AND WIRELESS COMMUNICATIONS DEVICE USING THE SAME

RELATED APPLICATIONS

This application claims priority to Japanese Patent Application Nos. 2003-331598 filed Sep. 24, 2003, 2003-331599 filed Sep. 24, 2003, and 2004-133684 filed Apr. 28, 2004 which are hereby expressly incorporated by reference herein in their entirety.

BACKGROUND

1. Technical Field

The present invention relates to a filter circuit used in a wireless communications device or the like and an impedance circuit, such as a matching circuit, and more particularly to an impedance circuit capable of operating in response to more than one frequency band, and a filter circuit, an amplifier circuit, a semiconductor integrated circuit, an electronic component, and a wireless communications device using such an impedance circuit.

2. Background Art

A system that uses switching over more than one frequency band has recently become known in a communications system. For example, in the wireless LAN method, the system switches from a 2.4 GHz band to a 5 GHz band and vice versa, or in the GSM method, the system switches from a 900 MHz band to a 1.8 GHz/1.9 GHz band and vice versa.

In a communications system configured to switch over more than one frequency band as described above, for the switching to be enabled, it is common to establish multiple signal paths for radio frequency bands in an RF portion, so that the signal paths are switched depending on the radio frequency band to be used.

For example, in the case of a filter circuit, as is shown in FIG. 21, a filter circuit 600 comprises filters 51 and 52 suitable for radio frequencies f1 and f2 in respective radio frequency bands, and switch circuits SW51 and SW52 provided respectively to the input end and the output end of these filters 51 and 52. The signal paths are switched by enabling either the filter 51 or 52 with the use of the switch circuits SW51 and SW52.

Also, for example, as is shown in FIG. 22, an amplifying element portion forming the RF portion is provided with amplifying elements 1101a and 1101b suitable for radio frequencies in respective radio frequency bands, and input matching circuits 1102a and 1102b and output matching circuits 1103a and 1103b are disposed before and after the amplifying elements 1101a and 1101b, respectively. By switching over a path for a first frequency signal f1 formed from the input matching circuit 1102a, the amplifying element 1101a, and t-he output matching circuit 1103a, and a path for a second frequency signal f2, formed from the input matching circuit 1102b, the amplifying element 1101b, and the output matching circuit 1103b, with the use of an input end change-over switch 1104 and an output-end change-over switch 1105 provided at an input end and an output end of the paths, respectively, a processing path is switched to either path suitable for the signal f1 or f2.

This is because it is practically difficult to achieve a circuit capable of attaining a satisfactory characteristic across all the usable bands, as respective circuits forming the RF portion. Even when a circuit is configured to attain a homogeneous characteristic across all the bands, the performance of such a circuit markedly deteriorates compared with a case where a circuit is formed separately for each usable frequency band. For this reason, it is common to form a circuit separately for each, frequency band.

However, in a case where a signal path forming the RF portion is provided separately for each frequency band to be used as described above, the number of components and an occupied area are increased, which makes it difficult to reduce the cost and the size of the circuits.

As a method of avoiding such problems, there have been proposed various methods by which a signal path forming the RF portion is shared by all the frequency bands.

For example, as a method of sharing a filter circuit forming the RF portion by more than one band, there has been proposed a method, by which a varactor diode is used in a resonant circuit to make a capacity variable with a control voltage supplied from the outside, so that a frequency band allowed to pass is changed by adjusting the resonance frequency (see, for example, Japanese Unexamined Patent Publication No. Hei-7-321586).

Also, as a method of sharing a matching circuit used for an amplifier forming the RF portion by more than one band, there has been proposed a method, by which an independent amplifying element is used, and matching circuits, as those at the input end and output end of the amplifier, are provided for each frequency, so that the system is able to respond to more than one frequency band by switching to the matching circuits corresponding to a frequency to be used, with the use of switches (see, for example, Japanese Unexamined Patent Publication No. Hei-5-37255).

In the case of a filter circuit, however, when a frequency band allowed to pass is changed by adjusting the resonance frequency as described above, there arises a need to use a low-Q element, such as a varactor diode, in the resonant circuit, which poses a problem in that the filter characteristic is deteriorated.

Also, when the matching circuits are switched to correspond to the frequency to be used as described above, the number of matching circuits increases with the number of usable frequencies. In particular, in terms of the area occupied by the circuits, the input and output matching circuits occupy a larger area than the active element portion, which poses a problem in that this configuration is less effective in achieving a fundamental reduction of the circuit size.

In addition, when the matching circuit is a matching circuit covering a broad band including usable frequencies and the circuit to be matched is an amplifier, a signal in a frequency band other than the desired frequency band is also amplified, which makes this configuration disadvantageous in terms of efficiency of the amplifier.

The invention was devised in view of the conventional problems that remain unsolved, and therefore relates to an impedance circuit capable of operating in response to more than one frequency band without deteriorating the characteristic or increasing the circuit size, and to a filter circuit, an amplifier circuit, a semiconductor integrated circuit, an electronic component, and a wireless communications device using such an impedance circuit.

SUMMARY

In order to achieve the above and other objects, an impedance circuit according to a first aspect of the invention is characterized by including: a first impedance element having at least one inductor; a second impedance element having at least one capacitor; a first switch and a second switch; and a first terminal and a second terminal used to establish an outside connection, wherein: one end of the first impedance element and one end of the second impedance element are connected to the first terminal; the other end of the first impedance element is connected to the first switch; the other end of the second impedance element is connected to the second switch; and one of the first switch and the second switch is connected to the second terminal and the other is connected to ground.

Herein, a low-pass filter circuit is formed by connecting the first impedance element having the inductor to the outside through the first switch and the second impedance element having the capacitor to ground through the second switch. In contrast, a high-pass filter circuit is formed by connecting the first impedance element having the inductor to ground through the first switch and the second impedance element having the capacitor to the outside through the second switch.

Hence, by switching the connected-ends of the first impedance element and the second impedance element with the use of the first switch and the second switch, it is possible to achieve an impedance circuit capable of processing signals in two frequency bands for a higher-frequency signal and a lower-frequency signal.

A second aspect of the invention is characterized in that the first switch and the second switch are configured to switch connected-ends of the first impedance element and the second impedance element depending on a frequency of an input signal.

According to the second aspect, by switching the connected-ends of the first impedance element and the second impedance element with the use of the first switch and the second switch depending on the frequency of an input signal, it is possible to achieve an impedance circuit having a characteristic suitable for the input signal.

A third aspect of the invention is characterized in that each of the first impedance element and the second impedance element is formed from a lumped element.

According to the third aspect, by forming the first impedance element and the second impedance element from a lumped element, it is possible to form an impedance circuit formed from a lumped circuit.

A fourth aspect of the invention is characterized in that at least one of the inductor and the capacitor is formed from a distributed element.

According to the fourth aspect, by forming at least one of the inductor and the capacitor that together form the impedance circuit from a distributed element, it is possible to form an impedance circuit formed from a distributed circuit.

A fifth aspect of the invention is characterized in that the first switch and the second switch perform the switching with the use of a semiconductor active element.

According to the fifth aspect, because the first and second switches switch the connected-ends of the first impedance element and the second impedance element with the use of a semiconductor active element, the switching can be performed with ease.

A sixth aspect of the invention is characterized in that the first switch and the second switch perform the switching with the use of a mechanical switch.

According to the sixth aspect, because the first and second switches switch the connected-ends of the first impedance element and the second impedance element with the use of a mechanical switch, the first switch and the second switch can be readily achieved.

A seventh aspect of the invention is characterized in that the impedance circuit forms a filter circuit.

According to the seventh aspect, because the impedance circuit forms the filter circuit, a high-pass filter circuit and a low-pass filter circuit can be formed by performing the switching with the use of the first switch and the second switch.

Hence, by switching the connected-ends of the first impedance element and the second impedance element with the use of the first switch and the second switch, it is possible to achieve a filter circuit capable of processing signals in two frequency bands for a higher-frequency signal and a lower-frequency signal.

An eighth aspect of the invention is characterized by further including a filter having a band-pass characteristic and cascade-connected to a connection end of the first impedance element and the second impedance element, or to an end of the first switch and the second switch.

According to the eighth aspect, for example, by setting the lower-limit cut-off frequency of a band-pass filter equal to or below a cut-off frequency of a low-pass filter when it is formed from an impedance circuit, which is the filter circuit according to the seventh aspect, or by setting an upper-limit cut-off frequency of the band-pass filter equal to or above a cut-off frequency of a high-pass filter when it is formed from the filter circuit, it is possible to form a band-pass filter having a pass band from the cut-off frequency of the band-pass filter to the cut-off frequency of the filter circuit.

A ninth aspect of the invention provides a filter circuit formed by cascade-connecting at least two impedance circuits, each forming a filter circuit, according to the seventh or eighth aspect.

According to the ninth aspect, by cascade-connecting the impedance circuits, forming the filter circuits having the same or comparable characteristics, an attenuation quantity in the outside of the band can be further increased, which in turn makes it possible to achieve a filter circuit having a satisfactory filter characteristic.

A tenth aspect of the invention is characterized in that the impedance circuit forms a matching circuit.

According to the tenth aspect, because the matching circuit is formed to serve as an impedance circuit, by performing the switching with the use of the first switch and the second switch, it is possible to achieve a high-pass filter type matching circuit and a low-pass filter type matching circuit.

Hence, by switching the connected-ends of the first impedance element and the second impedance element with the use of the first switch and the second switch, it is possible to achieve a matching circuit capable of processing signals in two frequency bands for a higher-frequency signal and a lower-frequency signal.

An eleventh aspect of the invention is characterized in that, in an impedance circuit forming a matching circuit, a circuit to be matched, the first switch, and the second switch are formed on the same substrate (a common substrate).

According to the eleventh aspect, by forming a circuit to be matched, the first switch, and the second switch on the same substrate, it is possible to further reduce the size of the impedance circuit that forms a matching circuit.

A twelfth aspect of the invention is characterized in that the impedance circuit according to the tenth or eleventh aspect is provided at least at one of an input end and an output end of an amplifier circuit.

According to the twelfth aspect, by providing a matching circuit at least at one of the input end and the output end of the amplifier circuit, the amplifier circuit can be reduced in size.

A thirteenth aspect of the invention provides an electronic component configured to include at least one of the following: the impedance circuit according to any of the first through eighth aspects, the tenth aspect, and the eleventh aspect; the filter circuit according to the ninth aspect; and the amplifier circuit according to the twelfth aspect.

According to the thirteenth aspect, an impedance circuit, which is capable of performing processing in response to more than one frequency band and forms a filter circuit or a matching circuit, or a filter circuit or an amplifier circuit configured to include this impedance circuit, can be formed by using fewer components. It is thus possible to reduce the size of an electronic component using any of these impedance circuit, filter circuit, and amplifier circuit.

A fourteenth aspect of the invention provides a wireless communications device configured to include at least one of the following: the impedance circuit according to any of the first through eighth aspects, the tenth aspect, and the eleventh aspect; the filter circuit according to the ninth aspect; and the amplifier circuit according to the twelfth aspect.

According to the fourteenth aspect, an impedance circuit, which is capable of performing processing in response to more than one frequency band and forms a filter circuit or a matching circuit, or a filter circuit or an amplifier circuit configured to include this impedance circuit, can be formed by using fewer components. It is thus possible to reduce the size of a wireless communications device using any of these impedance circuit, filter circuit, and amplifier circuit.

A fifteenth aspect of the invention provides a semiconductor integrated circuit, wherein an amplifier circuit and at least one switch, which is included in the impedance circuit according to any of the first through fourth aspects that forms a matching circuit for the amplifier circuit are formed integrally on the same substrate.

According to the fifteenth aspect, a semiconductor integrated circuit is provided by forming an amplifier circuit, and at least one switch included in the impedance circuit that forms a matching circuit for the amplifier circuit as a circuit to be matched, integrally on the same substrate. It is thus possible to reduce the size of an overall circuit.

A sixteenth aspect of the invention provides an electronic component configured to include the semiconductor integrated circuit according to the fifteenth aspect.

According to the sixteenth aspect, an amplifier circuit, provided with a matching circuit capable of performing processing in response to more than one frequency band, can be achieved by using fewer components. Hence, by using this semiconductor integrated circuit, it is possible to reduce the size of an electronic component using an amplifier circuit.

A seventeenth aspect of the invention provides a wireless communications device configured to include the semiconductor integrated circuit according to the fifteenth aspect.

According to the seventeenth aspect, an amplifier circuit, provided with a matching circuit capable of performing processing in response to more than one frequency band, can be achieved by using fewer components. Hence, by using this semiconductor integrated circuit, it is possible to reduce the size of a wireless communications device using an amplifier circuit.

BRIEF DESCRIPTION OF THE DRAWINGS

FIGS. 12(a) and (b) are smith charts showing an impedance characteristic of the matching circuit according to the fifth embodiment.

FIG. 13 is a view showing the configuration of an amplifying element provided with matching circuits, according to a sixth embodiment.

FIGS. 14(a) and (b) are circuit diagrams showing one example of respective matching circuits of FIG. 13.

FIGS. 16(a) and (b) are circuit diagrams showing one example of a matching circuit according to an eighth embodiment.

DETAILED DESCRIPTION

Embodiments of the invention will now be described.

First through fourth embodiments below will describe an impedance circuit of the invention used in a filter circuit.

First, a first embodiment will be described.

FIG. 1 is a circuit diagram showing one example of a filter circuit 100 using an impedance circuit of the invention.

Figure 1A:
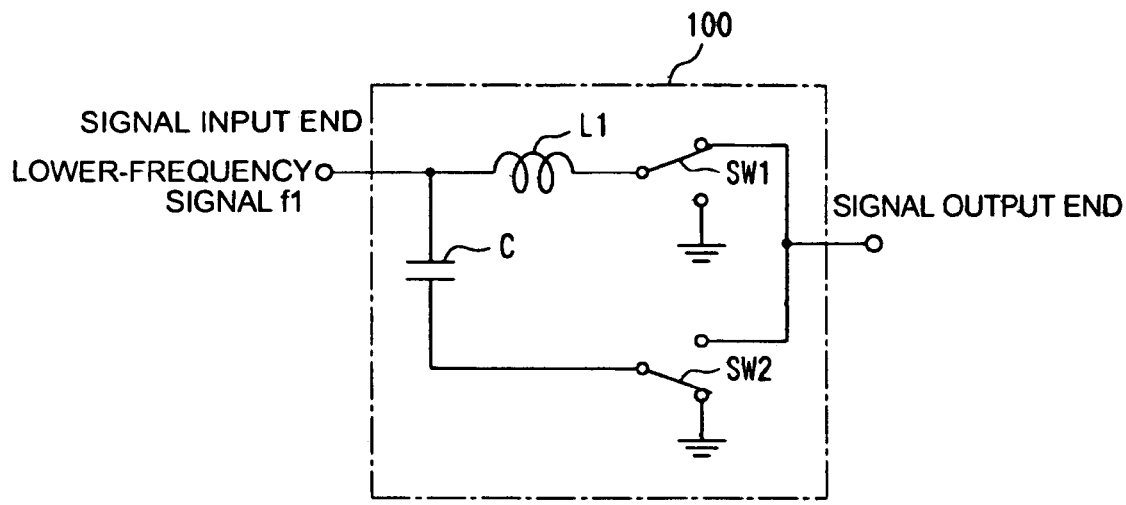
FIGS. 1(a) and (b) are circuit diagrams showing one example of a filter circuit according to a first embodiment, using an impedance circuit of the invention.

The filter circuit 100 according to the first embodiment comprises, as is shown in FIG. 1(a), an inductor L1 and a capacitor C which are lumped elements, and switch circuits SW1 and SW2. The inductor L1 forms a first impedance element and the capacitor C forms a second impedance element, while the switch circuits SW1 and SW2 form a first switch and a second switch respectively.

One end of the inductor L1 is connected to one end of the capacitor C to form a signal input end. Also, the other end of the inductor L1 is connected so the switch circuit, SW1, and the other end of the capacitor C is connected to the switch circuit SW2.

The switch circuit SW1 selectively connects the other end of the inductor L1 to either ground or a signal output end. Likewise, the switch circuit SW2 selectively connects the other end of the capacitor C to either ground or the signal output end. Also, these switch circuits SW1 and SW2 operate in association, and they operate in a manner so as to connect either the inductor L1 or the capacitor C to ground and the other to the signal output end.

The switch circuits SW1 and SW2 can be, for example, an active element made of a semiconductor, a mechanical switch, or a MEMS switch. That is to say, any type of switch can be used provided that it is able to switch the connected-ends of the inductor L1 and the capacitor C.

In addition, the switch circuits SW1 and SW2 may be switched by an operator's manipulation during use depending on the frequency band to be used, or the frequency band of an input signal may be detected, so that they are automatically switched according to the detection result.

In a case as is shown in FIG. 1(a) where the inductor L1 is connected to the signal output end and the capacitor C is connected to ground with the use of the switch circuits SW1 and SW2, a so-called low-pass filter circuit is formed. This circuit has a filter characteristic that allows only a low frequency band to pass as is shown in FIG. 2(a).

Figure 1B:
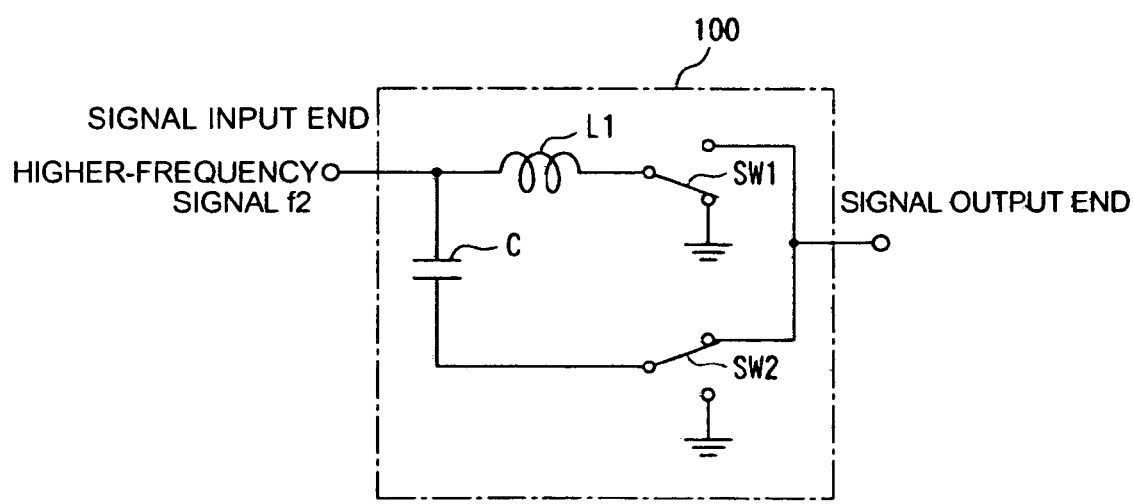

In contrast, in a case as is shown in FIG. 1(b) where the capacitor C is connected to the signal output end and the inductor L1 is connected to ground with the use of the switch circuits SW1 and SW2, a so-called high-pass filter circuit is formed. This circuit has a filter characteristic that allows only a high frequency band to pass as is shown in FIG. 2(b).

Figure 2A:
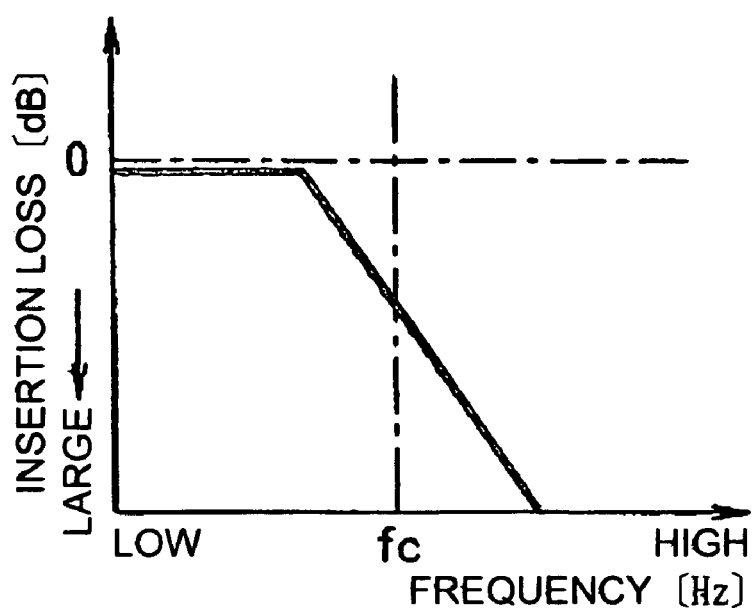
FIGS. 2(a) and (b) are pass characteristic views of the filter circuit according to the first embodiment.
Figure 2B:
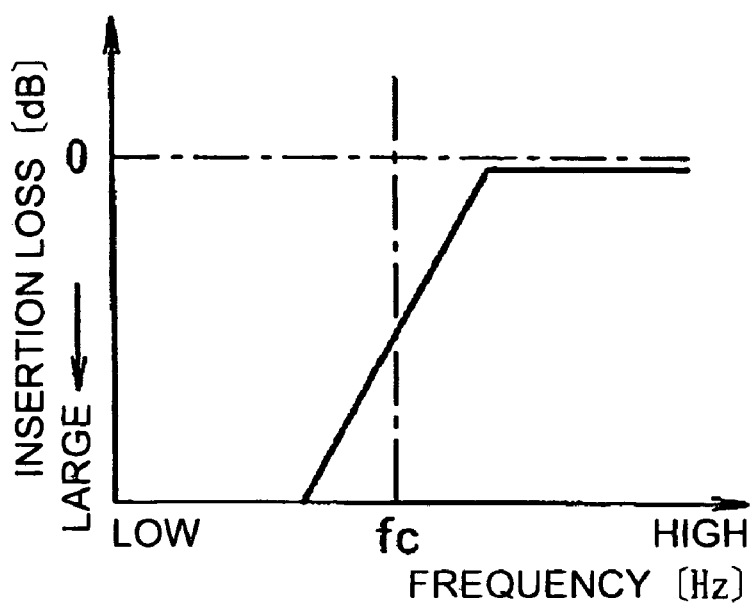

In FIG. 2(a) and FIG. 2(b), the abscissa is used for frequencies (Hz) and the ordinate is used for a filter insertion loss (dB). Also, fc denotes a cut-off frequency.

Operations in the first embodiment will now be described.

Assume that signals in two frequency bands, a 2.4 GHz band and a 5 GHz band, are to be processed in a wireless LAN system.

For example, in a case where a lower-frequency signal f1 in the 2.4 GHz band is to be processed, as is shown in FIG. 1(a), the capacitor C is connected to ground, and the inductor L1 is connected to the signal output end.

A low-pass filter circuit is thus formed, and this circuit has a filter characteristic that allows only a signal in a frequency band lower than the cut-off frequency fc to pass as is shown in FIG. 2(a). The lower-frequency signal f1 is thus allowed to pass.

On the other hand, in a case where a higher-frequency signal f2 in the 5 GHz band is to be processed, as is shown in FIG. 1(b), the inductor L1 is connected to ground, and the capacitor C is connected to the signal output end.

A high-pass filter circuit is thus formed, and this circuit has a filter characteristic that allows a signal in a frequency band higher than the cut-off frequency fc to pass as is shown in FIG. 2(b). The higher-frequency signal f2 is thus allowed to pass.

Hence, by manipulating the switch circuits SW1 and SW2 in the filter circuit 100, it is possible to form a filter circuit capable of operating in response to two frequency bands, the 2.4 GHz band and the 5 GHz band.

Figure 3:
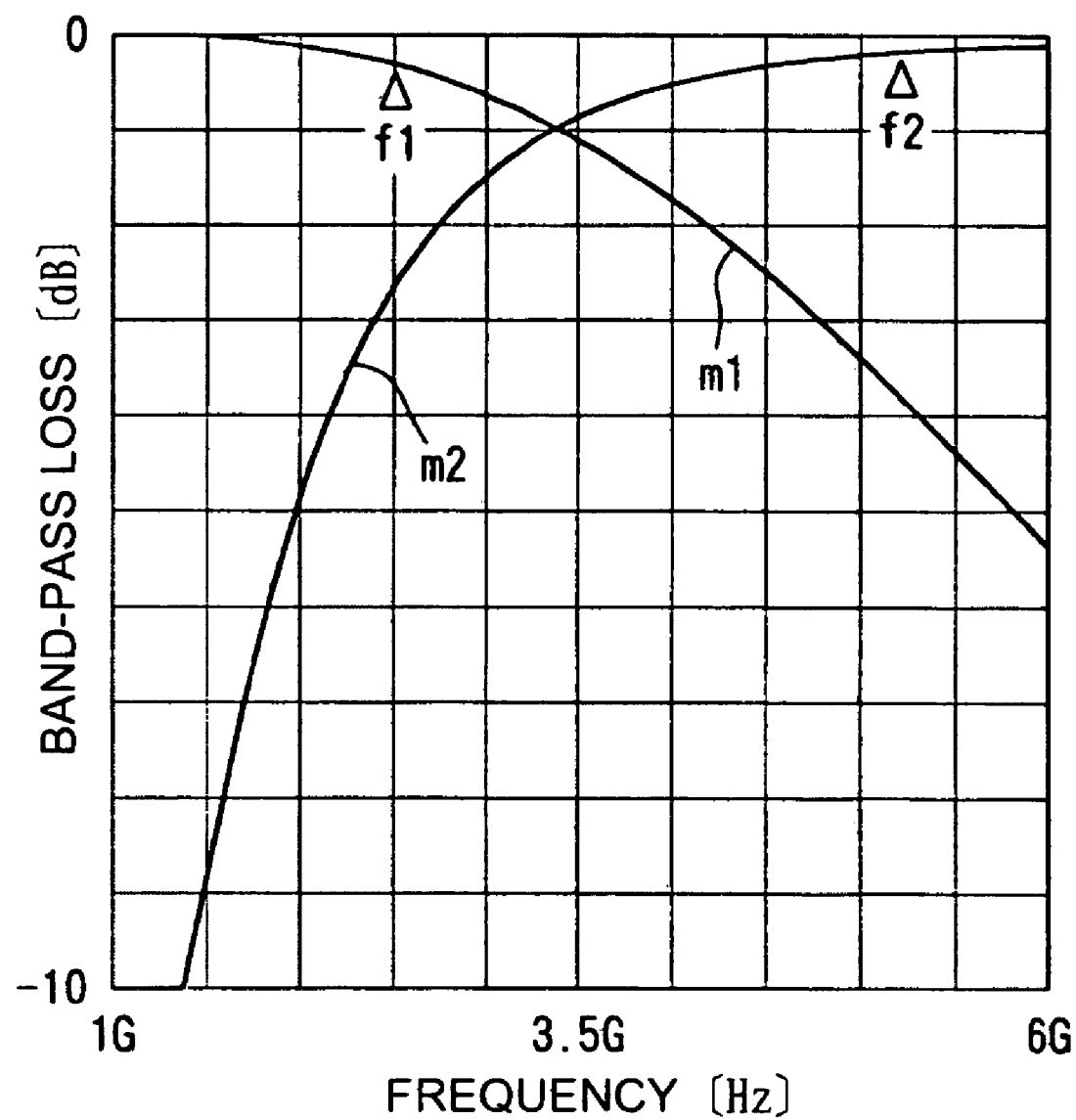
FIG. 3 shows a simulation result of the filter circuit according to the first embodiment.

FIG. 3 shows a simulation result of a filter output from the filter circuit 100 when signal frequencies were varied, using a signal in the 2.4 GHz band as the lower-frequency signal f1 and a signal in the 5 GHz band as the higher-frequency signal f2, and by selecting the respective elements forming the filter circuit 100 in such a manner that circuits formed as shown in FIG. 1(a) and FIG. 1(b) would have the pass characteristics as shown in FIG. 2(a) and FIG. 2(b), respectively. In FIG. 3, the abscissa is used for frequencies and the ordinate is used for a band-pass loss.

Referring to FIG. 3, a characteristic line m1 indicates a loss in a case where the low-pass filter circuit shown in FIG. 1(a) was-formed, and a characteristic line m2 indicates a loss in a case where the high-pass filter circuit shown in FIG. 1(b) was formed. In the case of forming the low-pass filter circuit, the circuit had a low-pass filter characteristic that, as the characteristic line m1 of FIG. 3 indicates, the loss is quite small in the vicinity of the 2.4 GHz band, and the loss becomes larger as the frequency becomes higher. In contrast, in the case of forming the high-pass filter circuit, the circuit had a high-pass filter characteristic that, as the characteristic line m2 indicates, the loss is quite small in the vicinity of the 5 GHz band, and the loss becomes smaller as the frequency becomes higher.

As has been described, the filter processing is enabled for two frequency bands by a single filter circuit 100. Hence, in a case where this filter circuit is used in a wireless communications device that performs processing for two radio frequency bands, unlike the conventional case, the need to provide a filter circuit for each frequency band can be eliminated. As a consequence, not only can the device be reduced in size, but also an area occupied by the filter circuit can be decreased. Moreover, the cost can be saved.

In addition, the filter circuit 100 can be achieved herein without having to use a low-Q element, such as a variable capacitance element. It is thus possible to achieve a filter circuit 100 having a satisfactory filter characteristic.

In particular, in the case of a wireless communications system, such as a wireless LAN, the filter processing is performed for plural, relatively remote frequency bands, the 2.4 GHz band and the 5 GHz band. However, by forming the low-pass filter circuit and the high-pass filter circuit through manipulations on the switch circuits as described above, it is possible to apply the filter processing to frequencies in a broad band. The filter circuit can be thus achieved without the need to use a low-Q element, such as a varactor diode, which makes it possible to attain a satisfactory filter characteristic.

The first embodiment described a case where signals in two frequency bands, the 2.4 GHz band and the 5 GHz band, are inputted. It should be appreciated, however, that the invention is not limited to this specific case, and for example, the invention can be applied to the switching of signals in arbitrary frequency bands, such as a 900 MHz band and a 1.8 GHz/1.9 GHz band in the GSM method.

A second embodiment of the invention will now be described.

A filter circuit 200 according to the second embodiment is, as is shown in FIG. 4, a filter circuit formed by using an inductor L2 which is a distributed element, instead of the inductor L1 which is a lumped element in the first embodiment shown in FIG. 1.

Figure 4A:
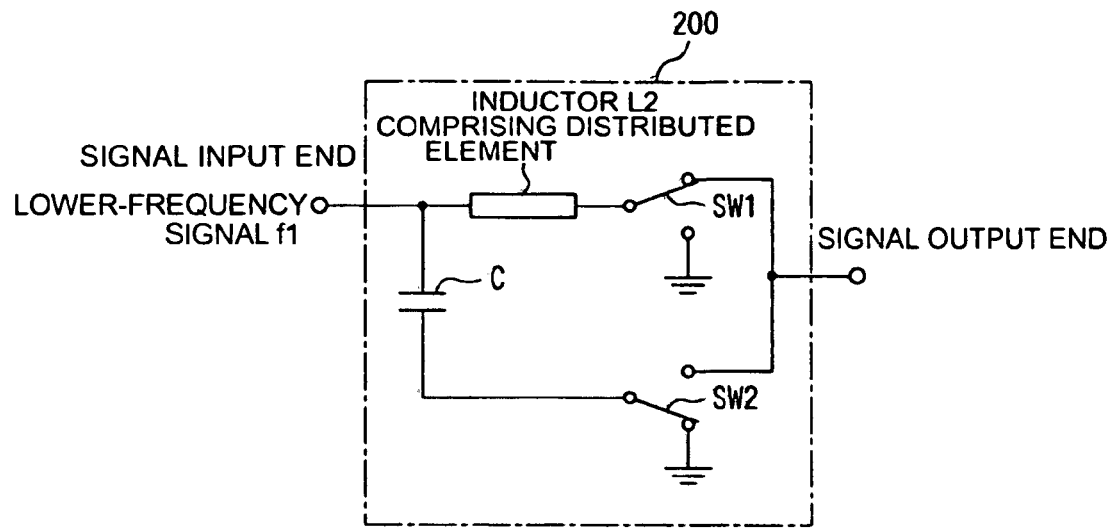
FIGS. 4(a) and (b) are circuit diagrams showing one example of a filter circuit according to a second embodiment.

In this case, too, when a lower-frequency signal f1 is to be processed, as is shown in FIG. 4(a), the inductor L2 is connected to the signal output end and the capacitor C is connected to ground by manipulating the switch circuits SW1 and SW2 to form a low-pass filter circuit. In contrast, when a higher-frequency signal f2 is to be processed, as is shown in FIG. 4(b), the capacitor C is connected to the signal output end and the inductor L2 is connected to ground to form a high-pass filter circuit.

Figure 4B:
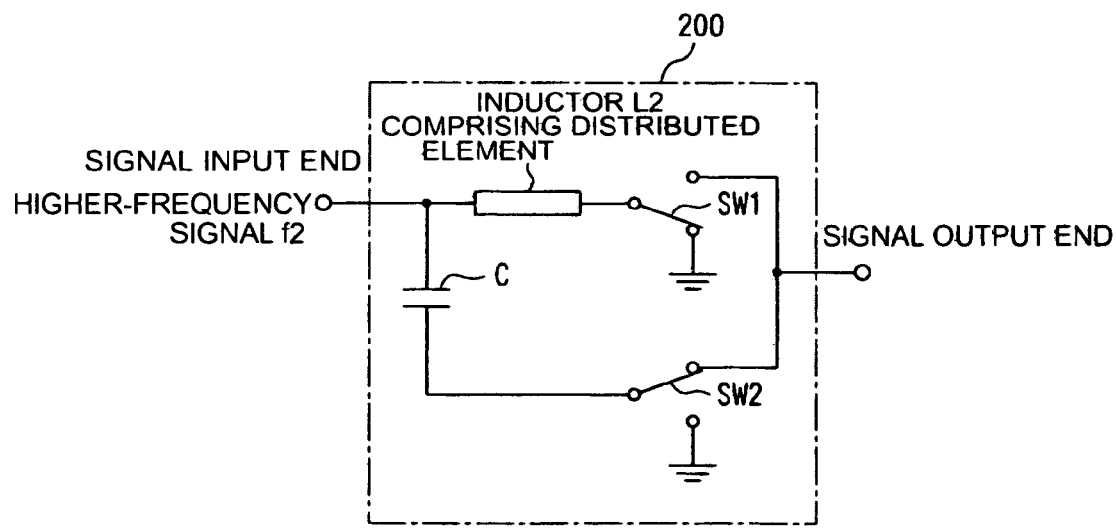
Figure 5:
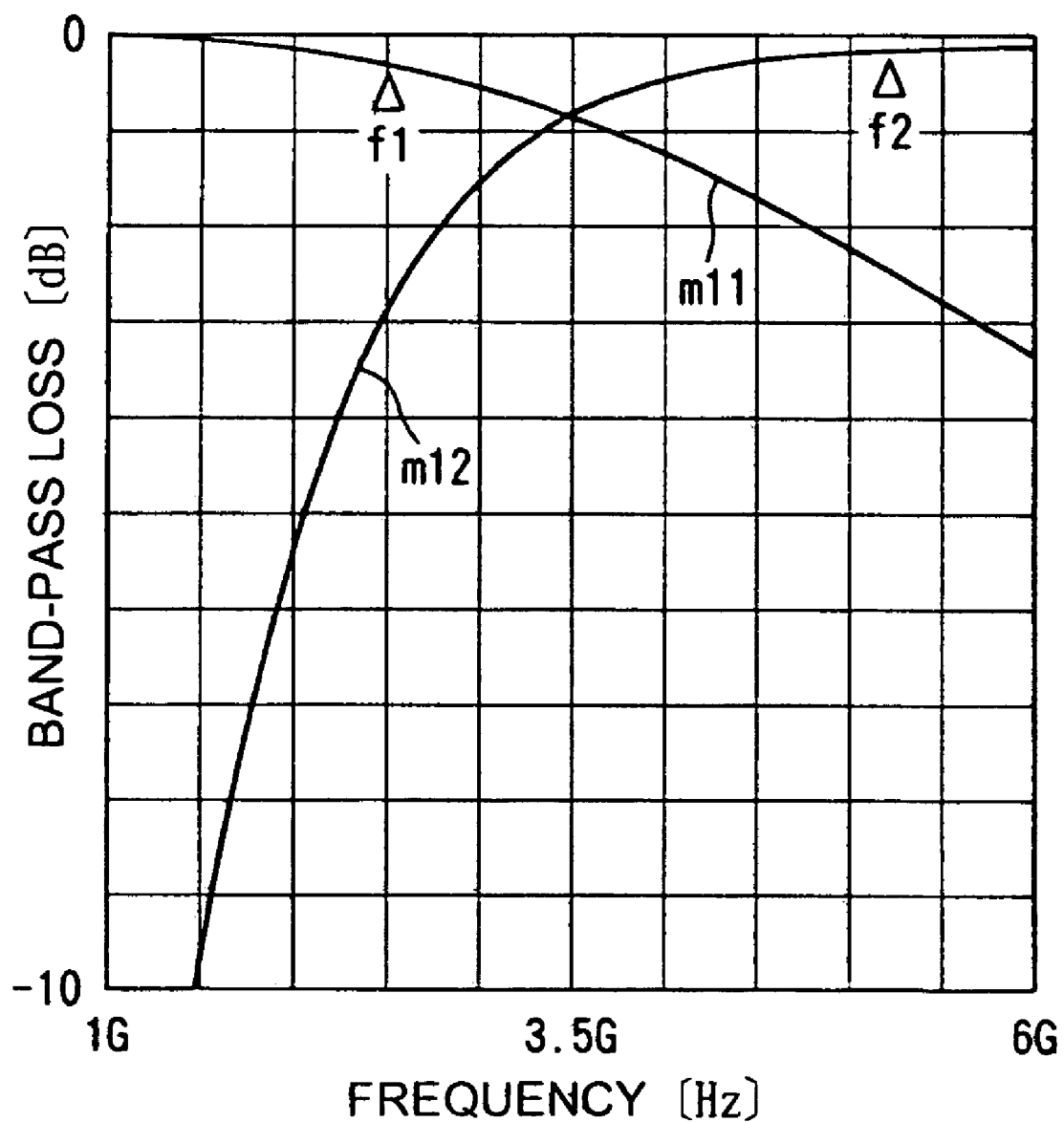
FIG. 5 shows a simulation result of the filter circuit according to the second embodiment.

FIG. 5 shows a simulation result of a filter output from the filter circuit 200 shown in FIG. 4 when signal frequencies were varied, using a signal in the 2.4 GHz band as the lower-frequency signal of and a signal in the 5 GHz band as the higher-frequency signal f2, and by selecting the respective elements forming the filter circuit 200 in such a manner that circuits formed as shown in FIG. 4(a) and FIG. 4(b) would show the pass characteristics for the 2.4 GHz band and the 5 GHz band, respectively. In FIG. 5, the abscissa is used for frequencies (Hz) and the ordinate is used for a band-pass loss (dB). Also, a characteristic line m11 indicates a case where the low-pass filter circuit shown in FIG. 4(a) was formed, and a characteristic line m12 indicates a case where the high-pass filter circuit shown in FIG. 4(b) was formed.

As is shown in FIG. 5, it is understood that in this case, too, by manipulating the switch circuits SW1 and SW2, it is possible to achieve a low-pass filter characteristic that the loss is small in the 2.4 GHz band, and a high-pass filter characteristic that the loss is small in the 5 GHz band.

Hence, the invention is applicable not only to a lumped circuit, but also to a distributed circuit.

The second embodiment described a case where the inductor L2 comprises a distributed constant element. It should be appreciated, however, that the invention is also applicable in a case where the capacitor C comprises a distributed constant element, or both the inductor L2 and the capacitor C comprise distributed constant elements.

In addition, in the first and second embodiments, the signal input end and the signal output end can be inverted. To be more specific, by manipulating the switch circuits SW1 and SW2, either the inductor or the capacitor can be connected to the signal input end. In this case, too, a high-pass filter circuit or a low-pass filter circuit can be formed as with each of the embodiments above, and therefore, operations and advantages equivalent to those described above can be achieved.

A third embodiment of the invention will now be described.

Figure 6:
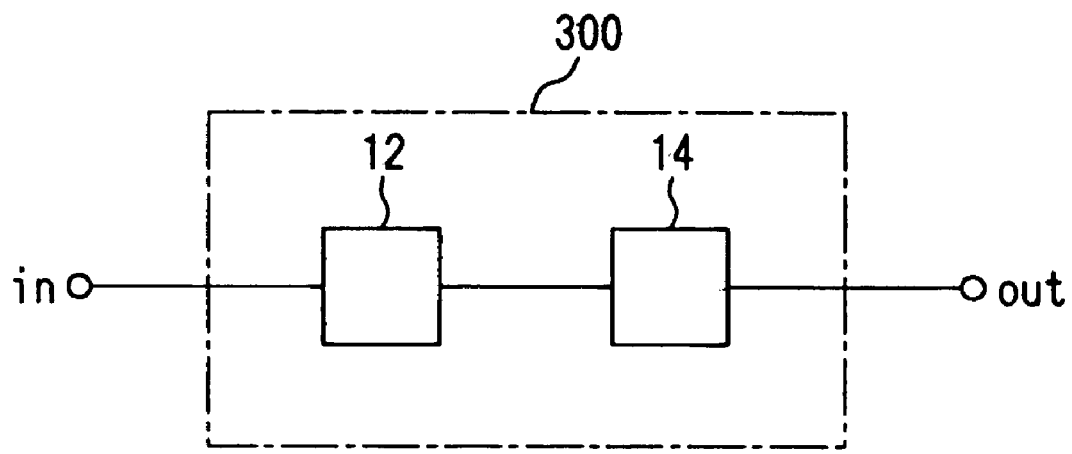
FIG. 6 is a block diagram of a filter circuit according to a third embodiment.

FIG. 6 shows the configuration of a filter circuit 300 according to the third embodiment, and as is shown in FIG. 6, the circuit 300 comprises a first filter portion 12, and a second filter portion 14 that uses an output of the first filter portion 12 as an input.

Each of the first filter portion 12 and the second filter portion 14 comprises the filter circuit 100 in the first embodiment, so that the first filter portion 12 and the second filter portion 14 are configured to have equal filter characteristics.

By connecting the first filter portion 12 and the second filter portion 14 having equal characteristics, that is, by connecting the filter circuits 100 in more than one stage, more rapid filter processing is enabled.

This embodiment described a case where the filter circuits are connected in two stages. However, when there is a need to secure a further sharper filter characteristic, the filter circuits are connected in three or more stages.

Also, this embodiment described a case where the first filter portion 12 and the second filter portion 14 comprise the filter circuits 100 in the first embodiment. It should be appreciated, however, that the filter circuit 300 can be formed by connecting the filter circuits 200 in the second embodiment in more than one stage. A sharper filter characteristic can be attained in this case, too.

A fourth embodiment of the invention will now be described.

Figure 7:
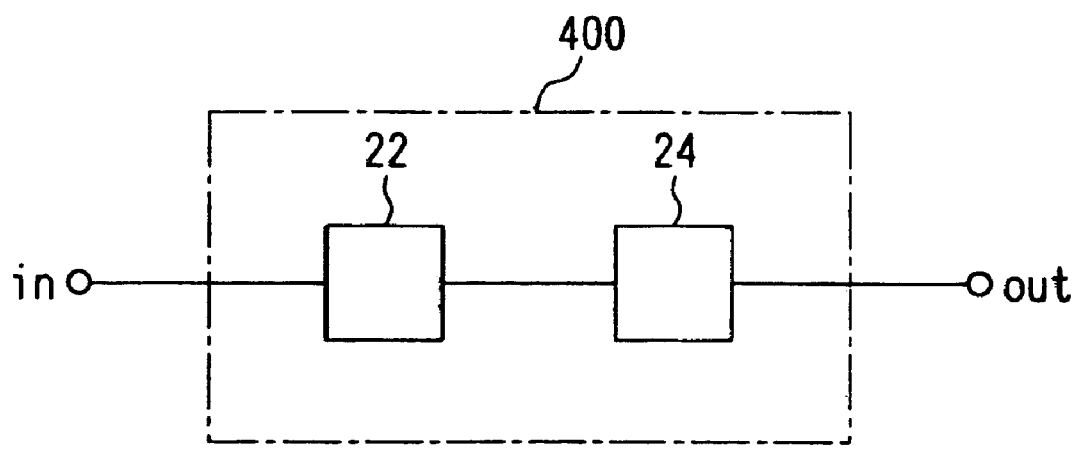
FIG. 7 is a block diagram of a filter circuit according to a fourth embodiment.

FIG. 7 shows the configuration of a filter circuit 400 according to the fourth embodiment. The filter circuit 400 comprises a first filter portion 22, and a second filter portion 24 that uses an output of the first filter portion 22 as an input.

The first filter portion 22 comprises the filter circuit 100 in the first embodiment.

Figure 8:
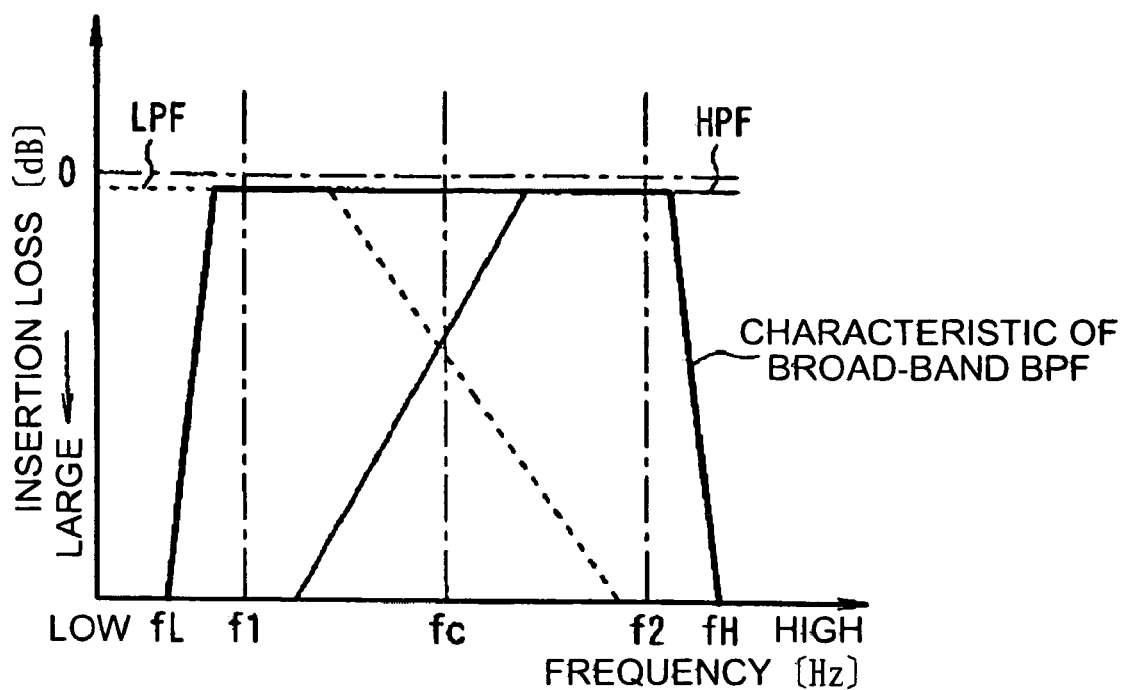
FIG. 8 is a frequency characteristic view of a second filter portion of FIG. 7.

The second filter portion 24 comprises a band-pass filter (BPF) having a broader frequency characteristic than the first filter portion 22. The pass band of the broad-band filter forming the second filter portion 24 is, as is shown in FIG. 8, set to include a range from the lower-frequency signal f1 to the higher-frequency signal f2 of the filter circuit 100 in the first embodiment that forms the first filter portion 22.

Figure 9:
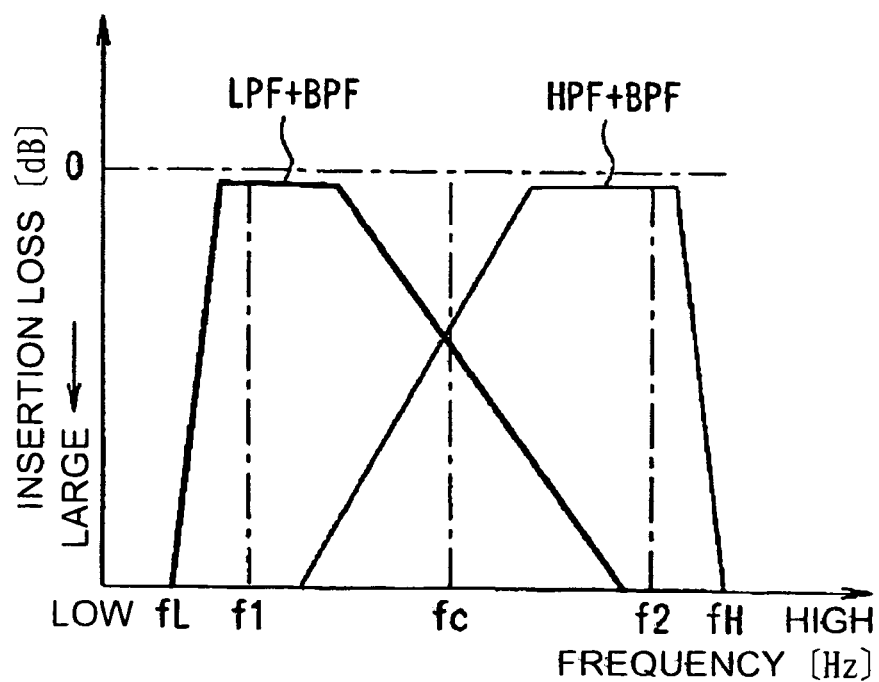
FIG. 9 is a pass characteristic view of the filter circuit according to the fourth embodiment.

A signal inputted to the filter circuit 400 thus undergoes the high-pass filter processing or the low-pass filter processing in the first filter portion 22, after which it further undergoes the band-pass filter processing in the second filter portion 24. In other words, the frequency characteristic of the filter circuit 400 is, as is shown in FIG. 9, a band-pass filter characteristic that the pass bands are a band (HPF+BPF) specified by the high-pass filter characteristic of the first filter portion 22 and the band-pass filter characteristic of the second filter portion 24, and a band (LPF+BPF) specified by the low-pass filter characteristic of the first filter portion 22 and a band-pass filter characteristic of the second filter portion 24.

Hence, by subordinating the second filter portion 24 comprising a band-pass filter to the first filter portion 22 in this manner, a band-pass filter circuit can be achieved in addition to the low-pass filter circuit or the high-pass filter circuit that can be achieved as described in the first embodiment. In FIG. 8 and FIG. 9, the abscissa is used for frequencies (Hz) and the ordinate is used for an insertion loss (dB).

This embodiment described the pass characteristic of the broad-band filter forming the second filter portion 24 in a case where the pass band is set to include a range from the lower-frequency signal f1 to the higher-frequency signal f2. It should be appreciated, however, that the invention is not limited to this specific case. That is to say, as are shown in FIG. 8 and FIG. 9, a band-pass filter having a pass band from the cut-off frequency of the broad-band filter (second filter portion 24) to the cut-off frequency of the filter circuit (first filter portion 22) 100 can be formed by bringing the lower-limit cut-off frequency fL of the broad-band filter into agreement with the cut-off frequency fc in a case where the low-pass filter comprises the filter circuit 100 forming the first filter portion 22 or setting the cut-off frequencies fL and fc to satisfy, fL<fc, or by bringing the upper-limit cut-off frequency fH of the broad-band filter into agreement with the cut-off frequency fc in a case where the high-pass filter comprises the filter circuit 100 or setting the cut-off frequencies fH and fc to satisfy, fH>fc.

In the fourth embodiment, the first filter portion 22 and the second filter portion 24 may be aligned in an inverse order, so that the low-pass filter or high-pass filter processing is performed after the band-pass filter processing is performed in the second filter portion 24. Operations and advantages equivalent to those described above can be achieved in this case, too.

In this case, the filter circuit 200 in the second embodiment can be used as the first filter portion 22 as well, and operations and advantages equivalent to those described above can be achieved in this case, too.

Herein, the switch circuits SW1 and SW2, forming the first filter portion 22, and the second filter portion 24 may be formed on the same substrate. When configured in this manner, the filter circuit 400 can be reduced in size.

Figure 10A:
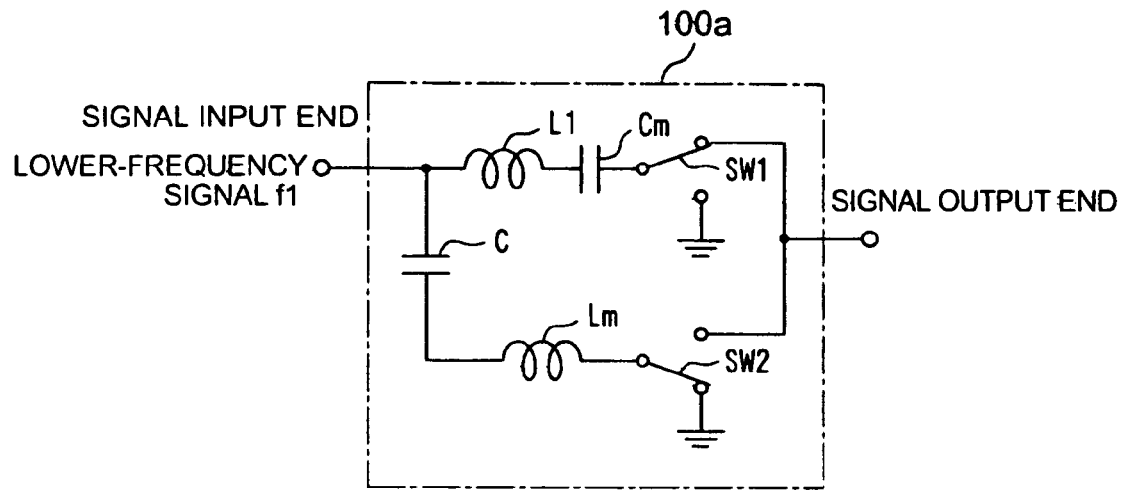
FIGS. 10(a) and (b) show another example of the filter circuit.
Figure 10B:
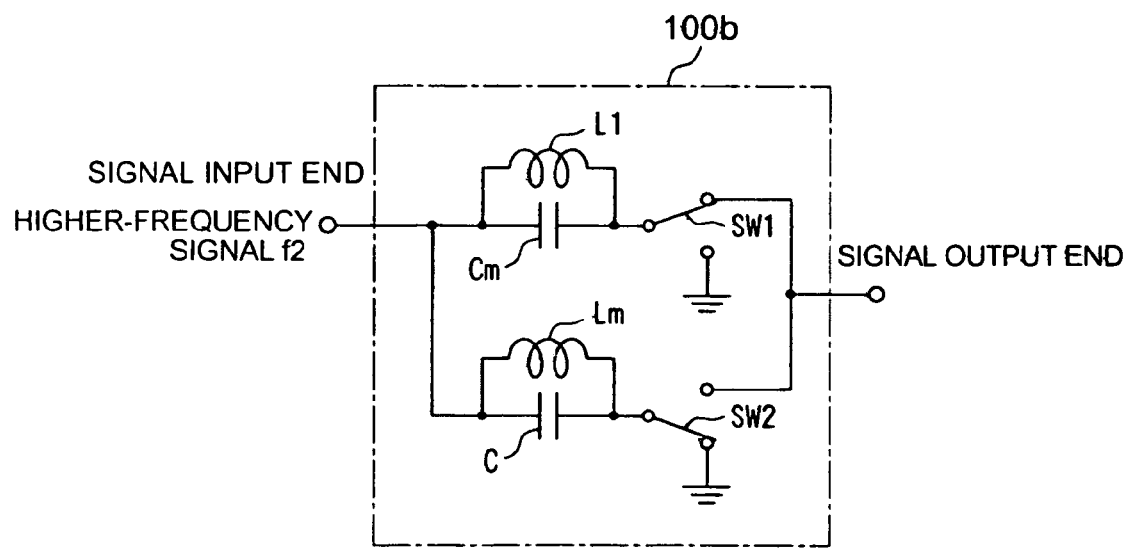

The first through fourth embodiments described a case where a filter circuit comprises a single inductor and a single capacitor. It should be appreciated, however, that the invention is not limited to this specific case, and for example, as is shown in FIG. 10(a), a filter circuit 100a may be formed by adding a capacitor Cm in series with the inductor L1 and adding an inductor Lm in series with the capacitor C in the filter circuit 100 of FIG. 1, or as is shown in FIG. 10(b), a filter circuit 100b may be formed by adding a capacitor Cm in parallel with the inductor L1 and adding an inductor Lm in parallel with the capacitor C in the filter circuit 100 of FIG. 1. That is to say, it is sufficient to include at least a single inductor and a single capacitor connected to one end of the inductor that together form a basic filter circuit, in such a manner that a circuit having the low-pass filter characteristic and a circuit having the high-pass filter characteristic, or a circuit having comparable filter characteristics can be formed by switching the connected-ends of the other end of the inductor and the other end of the capacitor. With the aim to reduce irregularities of the inductor and the capacitor or a power loss, an additional capacitor, inductor, etc., can be connected in parallel or in series with the inductor and the capacitor forming the basic filter circuit.

Alternatively, for example, an impedance matching circuit or the like may be formed additionally, with the use of the filter circuit in any of the first through fourth embodiments. As has been described, because a filter circuit having a satisfactory filter characteristic can be achieved, it is possible to achieve an impedance matching circuit having a more ideal circuit characteristic with the use of this filter circuit.

A fifth embodiment of the invention will now be described.

Fifth through eighth embodiments below will describe a case where the impedance circuit of the invention is used in a matching circuit.

FIG. 11 is a circuit diagram showing one example of a matching circuit 1100.

Figure 11A:
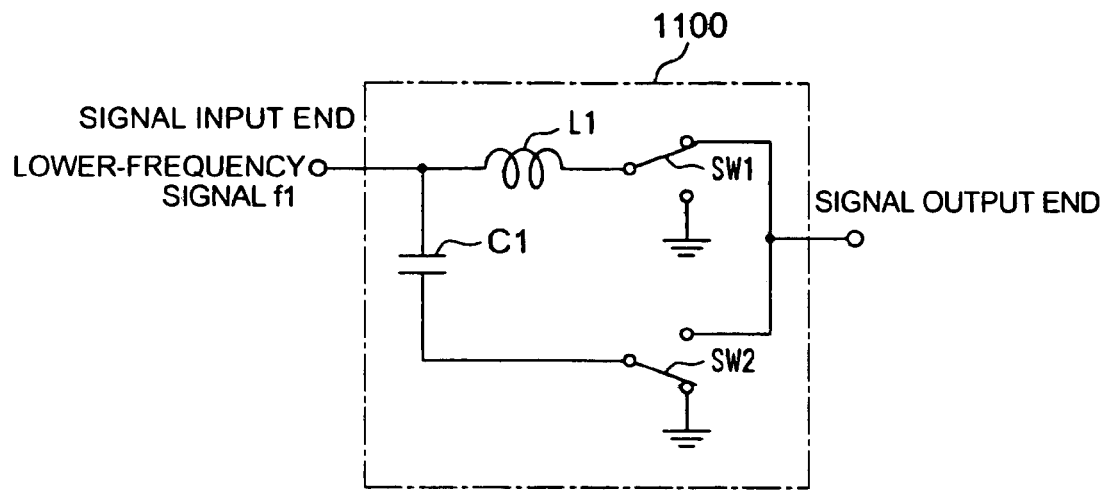
FIGS. 11(a) and (b) are circuit diagrams showing one example of a matching circuit according to a fifth embodiment, using an impedance circuit of the invention.

As is shown in FIG. 11(a), the matching circuit 1100 comprises, same as with the filter circuit 100 of the first embodiment, an inductor L1 and a capacitor C1 formed from lumped elements, and switch circuits SW1 and SW2.

One end of the inductor L1 is connected to one end of the capacitor C1 to form a signal input end. The other end of the inductor L1 is connected to the switch circuit SW1, while the other end of the capacitor C1 is connected to the switch circuit SW2.

The switch circuit SW1 selectively connects the other end of the inductor L1 to either ground or a signal output end. Likewise, the switch circuit SW2 selectively connects the other end of the capacitor C1 to either ground or the signal output end. In addition, these switch circuits SW1 and SW2 operate in association, and thee operate in a manner so as to connect either the inductor L1 or the capacitor C1 to ground and the other to the signal output end.

The inductor L1 corresponds to a first impedance element and the capacitor C1 corresponds to a second impedance element. Also, the switch circuits SW1 and SW2 correspond to a first switch and a second switch, respectively. The switch circuits SW1 and SW2 can be, for example, an active element made of a semiconductor, a mechanical switch, or a HEMS switch. That is to say, any type of switch can be used provided that it is able to switch the connected-ends of the inductor L1 and the capacitor C1.

In addition, the switch circuits SW1 and SW2 may be switched manually during use, or the frequency band of an input signal may be detected, so that they are automatically switched according to the detection result.

In a case as is shown in FIG. 11(a) where the inductor L1 is connected to the signal output end and the capacitor C1 is connected to ground with the use of the switch circuits SW1 and SW2, a so-called low-pass filter type matching circuit is formed. Hence, by using an element having a suitable element value, it is possible to attain a signal source impedance characteristic matched with an active element to be matched, at the signal output end of the matching circuit 1100.

FIG. 12(a) shows an impedance characteristic when a suitable values of the inductor L1 and the capacitor C1 are used in the matching circuit 1100 in a case where the signal input end is terminated, for example, with 50Ω, using a lower-frequency signal f1 for example, in a 2.4 GHz band in a wireless LAN system. As is indicated by a marker M1 in FIG. 12(a), the matching circuit 1100 has an inductive impedance characteristic in the 2.4 GHz band.

Figure 11B:
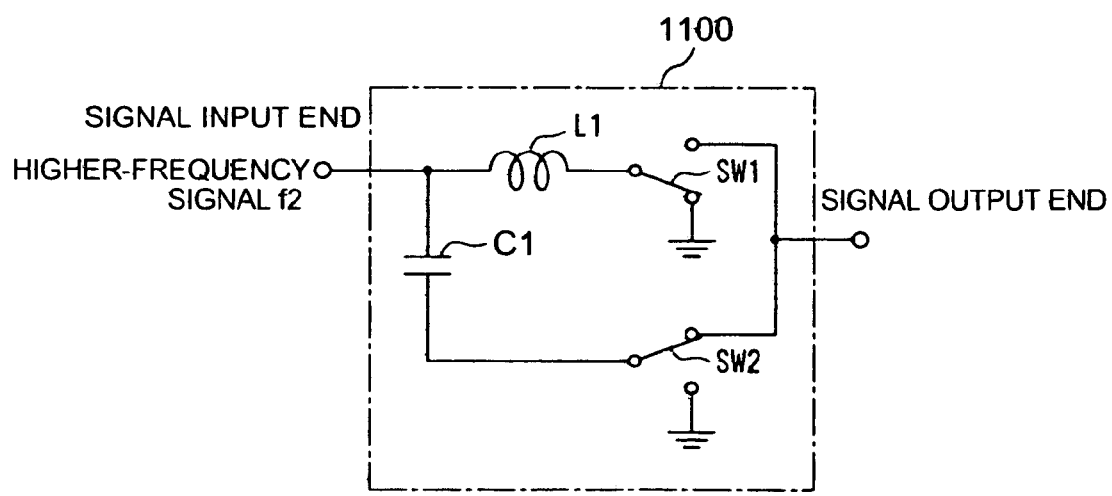

In contrast, in a case as is shown in FIG. 11(b) where the capacitor C1 is connected to the signal output end and the inductor L1 is connected to ground with the use of the switch circuits SW1 and SW2, a so-called high-pass filter type matching circuit is formed. Hence, by using suitable values of the elements L1 and C1, it is possible to attain a signal source impedance characteristic matched with an active element to be matched, at the signal output end of the matching circuit 1100.

FIG. 12(b) shows an impedance characteristic when suitable values of the elements L1 and C1 are used in the matching circuit 1100 in a case where the signal input end is terminated, for example, with 50 Ω, using a higher-frequency signal f2, for example, in a 5 GHz band in a wireless LAN system. As is indicated by a marker M2 in FIG. 12(b), the matching circuit 1100 has a capacitive impedance characteristic in the 5 GHz band.

As has been described, the input and output impedances can be changed by a single matching circuit, and therefore, by setting the element value adequately, it is possible to achieve a matching circuit that alone is suitable for two frequency bands.

This configuration, unlike the conventional case, eliminates the need to provide a matching circuit suitable for each frequency band, and a single matching circuit is sufficient. Hence, not only can the overall device, such as a wireless communications device, supporting more than one frequency band, be reduced in size, but also costs can be saved.

In particular, in a case where two signals in the 2.4 GHz band and the 5 GHz band, are to be processed, that is, in the case of performing the processing in the signal bands where a frequency characteristic of the high frequency band is twice that of the low frequency band, so that the two signal bands are readily isolated from each other, the invention is suitable because the signal bands can be isolated at a higher degree of accuracy.

A sixth embodiment of the invention will now be described.

FIG. 13 is a block diagram showing one example of an amplifying element provided with matching circuits. An input matching circuit 2 is provided at the input end of an amplifying element 1 and an output matching circuit 3 is provided at the output end of the amplifying element 1.

As is shown in FIG. 14(a), the input matching circuit 2 comprises the matching circuit 1100 described in the fifth embodiment.

Also, the output matching circuit 3 is configured in such a manner that the signal input end and the signal output end are inverted in the matching circuit 1100 shown in FIG. 11(a). In other words, as is shown in FIG. 14(a), one end of an inductor L2 is connected to either the signal input end or ground with the use of a switch circuit SW3, and the other end of the inductor L2 forms the signal output end. In addition, one end of a capacitor C2 is connected to either the signal input end or ground with the use of a switch circuit SW4, and the other end of the capacitor C2 is connected the inductor L2 at the end forming the signal output, end. The switch circuits SW3 and SW4 operate in association, so that either the inductor L2 or the capacitor C2 is connected to the signal input end and the other is connected to ground.

Operations in the sixth embodiment will now be described.

Assume that signals in two frequency bands, a 2.4 GHz band and a 5 GHz band, are to be processed in a wireless LAN system.

For example, when a lower-frequency signal f1 in the 2.4 GHz band is to be amplified, as is shown in FIG. 14(a), the capacitors C1 and C2 respectively in the input matching circuit 2 and the output matching circuit 3 are connected to ground, and the inductor L1 is connected to the signal output end, that is, to the input end of the amplifying element 1. Also, the inductor L2 is connected to the signal input end, that is, to the output end of the amplifying element 1. Low-pass filter type input matching circuit 2 and output matching circuit 3, in which the capacitors C1 and C2 are connected to ground, are thus formed.

On the other hand, when a higher-frequency signal f2 in the 5 GHz band is to be amplified, as is shown in FIG. 14(b), the inductors L1 and L2 are connected to ground, while the capacitor C1 is connected to the input end of the amplifying element 1 and the capacitor C2 is connected to the output end of the amplifying element 1. High-pass filter type input matching circuit 2 and output matching circuit 3, in which the inductors L1 and L2 are connected to ground, are thus formed.

Same as with the fifth embodiment, the values of the elements L1 and C1 in the input matching circuit 2 and the output matching circuit 3 are set in such a manner that when a low-pass filter type matching circuit is formed, it will have an inductive impedance characteristic, as is shown in FIG. 12(a), in the 2.4 GHz band, and when a high-pass filter type matching circuit is formed, it will have a capacitive impedance characteristic, as is shown in FIG. 12(b), in the 5 GHz band.

In the case of the 2.4 GHz band, by forming a low-pass filter type matching circuit by manipulating the switch circuits SW1 through SW4, a matching circuit having an inductive impedance characteristic is formed. Also, in the case of the 5 GHz band, by forming a high-pass filter type matching circuit by manipulating the switch circuits SW1 through SW4, a matching circuit having a capacitive impedance characteristic is formed. Hence, by providing a pair of input and output matching circuits for two signals in different frequency bands, it is possible to achieve a matching circuit suitable for the respective frequency bands.

In particular, the input and output impedances of the amplifying element shift from capacitive to inductive as the frequency becomes higher. It is thus necessary for the matching circuit connected to the amplifying element to have the impedance that shifts from inductive to capacitive as the frequency becomes higher. As has been described, by forming a matching circuit as is shown in FIG. 11, a single matching circuit can attain an inductive impedance characteristic when a frequency is low, and a capacitive impedance characteristic when a frequency is high. The matching circuit of the invention is therefore suitable for an input matching circuit and an output matching circuit for an amplifying element.

Also, in particular, when a matching circuit, covering a broad band, is connected with the amplifying element 1, a signal in a frequency band other than the desired frequency band is also amplified, which is disadvantageous in terms of efficiency of the amplifying element 1. However, by adequately selecting the values of the elements L1 and C1 as described above, it is possible to avoid an event wherein a signal other than a signal of a desired frequency is amplified, which can in turn improve the amplification efficiency.

In the sixth embodiment, because the amplifying element 1 is connected directly to the respective switch circuits SW1 through SW4, these components can be suitably made into a single semiconductor integrated circuit. This configuration is quite effective in further reducing the circuit size.

A seventh embodiment of the invention will now be described.

In input and output matching circuits according to the seventh embodiment, as is shown in FIG. 15, the positions of the switch circuits, the inductor, and the capacitor that together form each matching circuit, are inverted with respect to the matching circuit in the sixth embodiment.

Figure 15A:
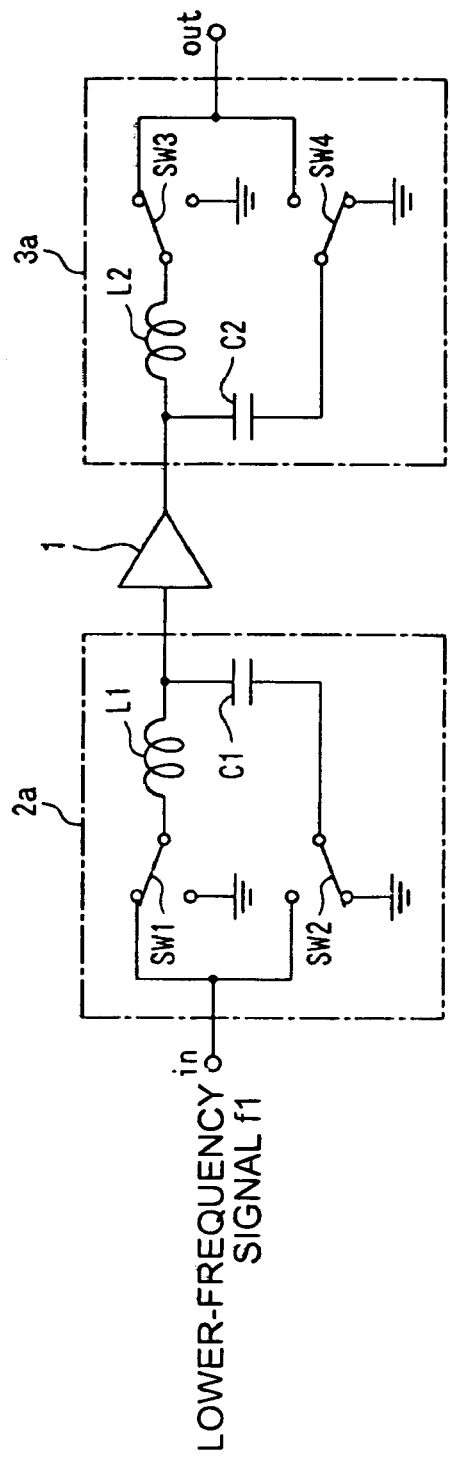
FIGS. 15(a) and (b) are circuit diagrams showing one example of a matching circuit according to a seventh embodiment.

In other words, an input matching circuit 2a in the seventh embodiment is configured in such a manner that, as is shown in FIG. 15(a), one end of the inductor L1 is connected to one end of the capacitor C1 and this connection point is connected to the input end of the amplifying element 1. Either the other end of the inductor L1 or the other end of the capacitor C1 is connected to the signal input end, and the other is connected to ground with the use of switch circuits SW1 and SW2.

Likewise, in an output matching circuit 3a, one end of the inductor L2 is connected to one end of the capacitor C2, and this connection point is connected to the output end of the amplifying element 1. Either the other end of the inductor L2 or the other end of the capacitor C2 is connected to the signal output end, and the other is connected to ground with the use of switch circuits SW3 and SW4.

Figure 15B:
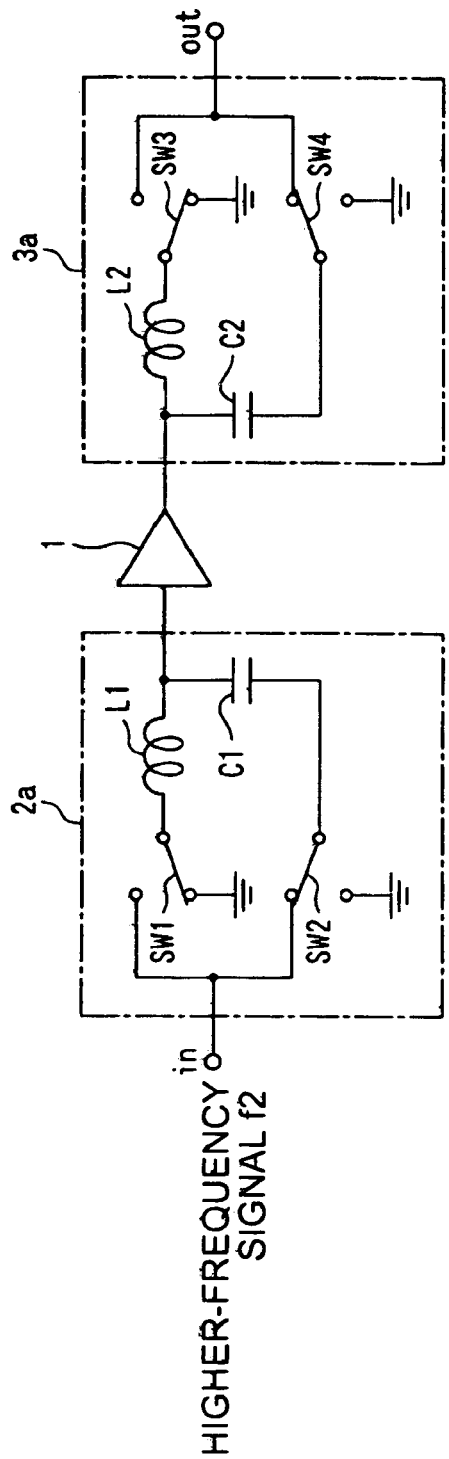

In this case, too, as with the sixth embodiment, when a lower-frequency signal f1 in the 2.4 GHz band is to be processed, for example, as is shown in FIG. 15(a), low-pass filter type input matching circuit 2a and output matching circuit 3a are formed, and when a higher-frequency signal f2 in the 5 GHz band is to be processed, for example, as is shown in FIG. 15(b), high-pass filter type input matching circuit 2a and output matching circuit 3a are formed, by manipulating the switch circuits SW1 through SW4. When configured in this manner, operations and advantages equivalent to those attained in the sixth embodiment can be achieved.

An eighth embodiment of the invention will now be described.

As is shown in FIG. 16, in the eighth embodiment, a matching circuit is formed by using inductors Ld1 and Ld2 which are distributed elements, instead of the inductor used in the matching circuit in the sixth embodiment. In short, each of an input matching circuit 2b and an output matching circuit 3b comprises a distributed circuit.

Because inductive and capacitive impedance characteristics can be attained by manipulating the switch circuits SW1 through SW4 in this case, too, the invention is applicable not only to a lumped circuit, but also to a distributed circuit.

The eighth embodiment described a case where the matching circuit comprises a distributed element in the sixth embodiment. However, it goes without saying that the matching circuit can comprise a distributed element in the seventh embodiment. Also, the eighth embodiment described a case where the inductor comprises a distributed element. It should be appreciated, however, that the invention is also applicable to a case where each capacitor comprises a distributed element or to a case where both the inductor and the capacitor comprise distributed elements.

In the sixth through eighth embodiments, the amplifying element 1, the switch circuits SW1 and SW2 in the input matching circuit 2, and the switch circuits SW3 and SW4 in the output matching circuit 3 may be formed on the same active element substrate (a common substrate). To be more specific, for example, in the case of the sixth embodiment, as is shown in FIG. 14, a portion enclosed by an alternate long and short dash line to include the amplifying element 1, the switch circuits SW1 and SW2 in the input matching circuit 2, and the switch circuits SW3 and SW4 in the output matching circuit 3 may be formed on the same substrate. When configured in this manner, the overall circuit can be reduced in size more easily.

The fifth through eighth embodiments described a case where signals in two frequency bands, the 2.4 GHz band and the 5 GHz band, are inputted. It should be appreciated, however that the invention is not limited to this specific case. For example, signals in arbitrary frequency bands can be inputted for the switching, for example, between a 900 MHz band and a 1.8 GHz/1.9 GHz band in the GSM method.

Figure 17A:
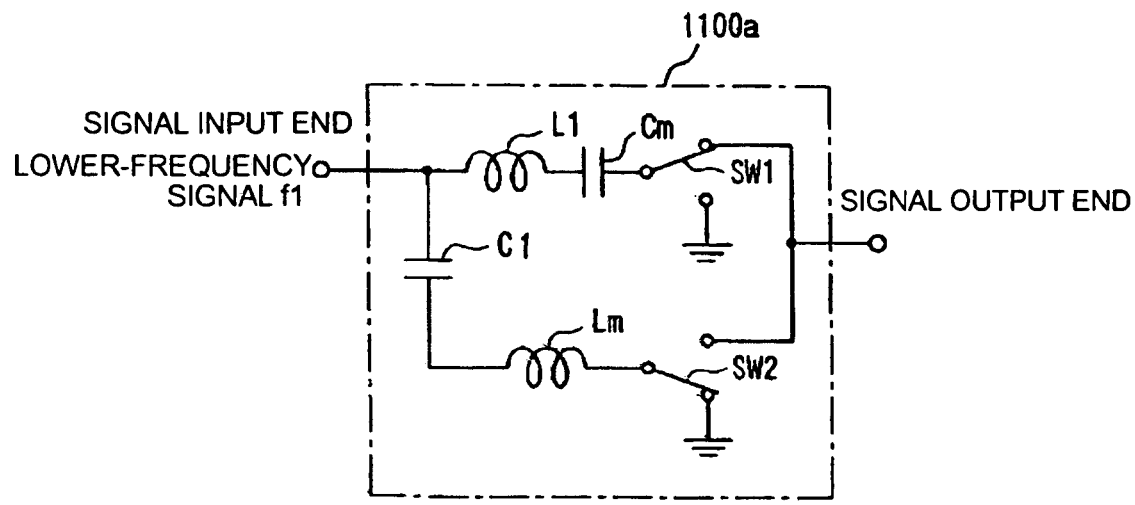
FIGS. 17(a) and (b) are circuit diagrams showing another example of the matching circuit.
Figure 17B:
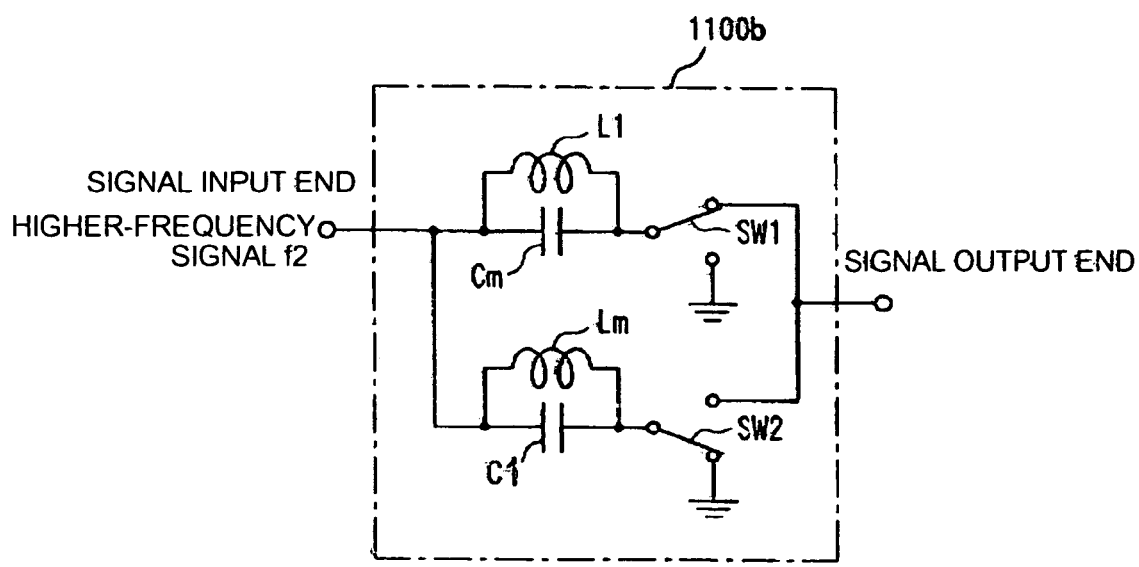

The fifth through eighth embodiments described a case where a matching circuit comprises a single inductor and a single capacitor. It should be appreciated, however, that the invention is not limited to this specific case, and for example, as is shown in FIG. 17(a), a filter circuit 1100a may be formed by adding a capacitor Cm in series with the inductor L1 and adding an inductor Lm in series with the capacitor C1 to the matching circuit 1100 of FIG. 11, or as is shown in FIG. 17(b), a filter circuit 1100b may be formed by adding a capacitor Cm in parallel with the inductor L1 and adding an inductor Lm in parallel with the capacitor C1 to the matching circuit 1100 of FIG. 11. That is to say, it is sufficient to include a single inductor and a single capacitor connected to one end of the inductor that together form a basic matching circuit in a manner so as to be able to supply an impedance characteristic needed for each frequency band in a circuit to be connected, by setting values of the inductor and the capacitor to optimal values and by switching the connected-ends of the other ends of the inductor and capacitor.

The fifth through eighth embodiments described a case where the amplifying element 1 is used as a circuit to be matched, it should be appreciated, however, that the invention is not limited to this specific case, and the invention is applicable to any circuit that needs to be matched, such as an active element like a transistor, or a circuit having a filter characteristic, etc.

Figure 18A:
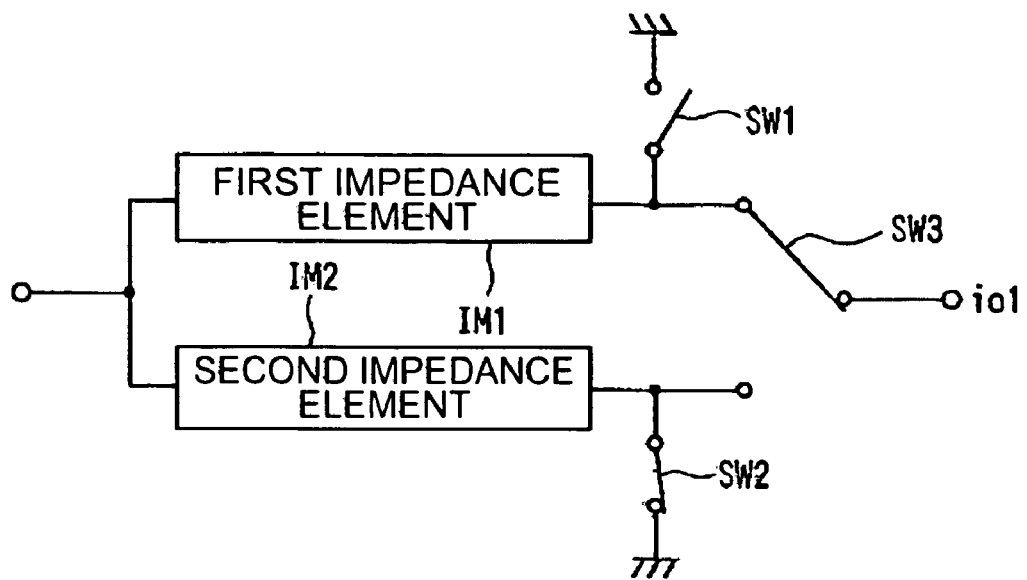
FIGS. 18(a) and (b) are circuit diagrams showing another example of the impedance circuit.
Figure 18B:
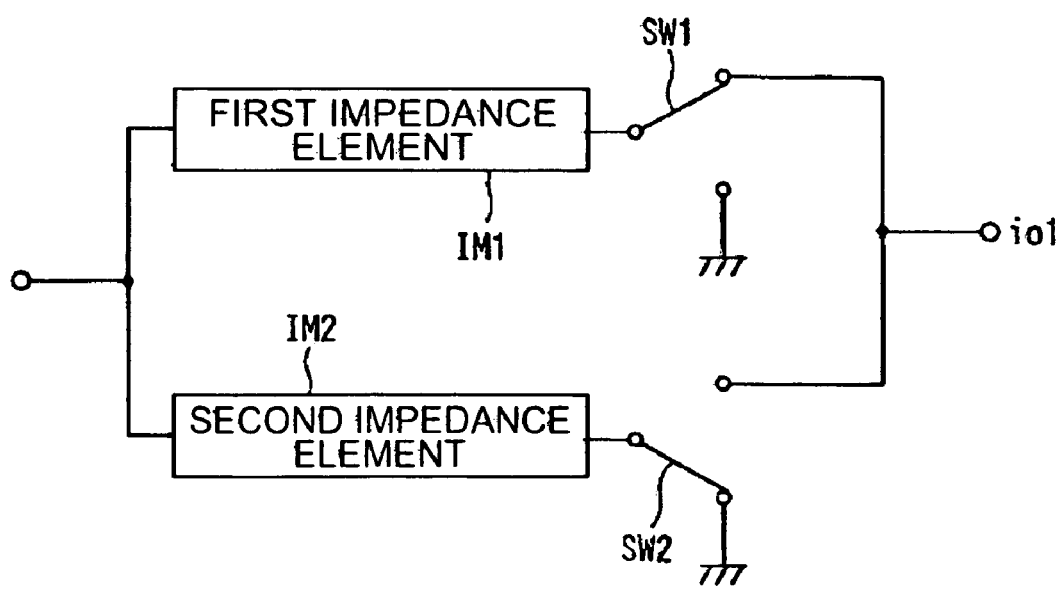

Also, each of the embodiments above described a case, as is shown in FIG. 18(b), where one end of a first impedance element IM1 comprising, for example, one or more inductors, and one end of a second impedance element IM2 comprising, for example, one or more capacitors, are connected to a signal input/output end io1 or to ground with the use of the switch circuits SW1 and SW2. It should be appreciated, however, that the invention is not limited to this specific case. Two or more switch circuits SW may be provided or the switch circuits SW may be provided at arbitrary positions, provided that either the first impedance element IM1 or the second impedance element IM2 is connected to the input/output end io1 and the other is connected to ground as a result.

For example, as is shown in FIG. 18(a), a switch circuit SW3 may be provided between the switch circuits SW1 and SW2 and the signal input/output end io1, so that the switch circuit SW1 operates as a switch circuit that connects one end of the first impedance element IM1 to ground and the second switch circuit SW2 operates as a switch circuit that connects one end of the second impedance element IM2 to ground. Further, the switch circuit SW3 may operate as a switch circuit that selectively connects either one end of the first impedance element IM1 or one end of the second impedance element IM2 to the input/output end io1. In this case, as is shown in FIG. 18(a), by disconnecting the switch circuit SW1 switching the switch circuit SW3 to the first impedance element IM1 and bringing the switch circuit SW2 in an electrical conduction state, a filter circuit or a matching circuit having either the high-pass filter or low-pass filter characteristic can be formed. In contrast, by bringing the switch circuit SW1 into an electrical conduction state, switching the switch circuit SW3 to the second impedance element IM2, and disconnecting the switch circuit SW2, a filter circuit or a matching circuit having either the high-pass filter or low-pass filter characteristic can be formed.

It should be noted, however, that, for example, as is shown in FIG. 18(b), in a case where the connections of the first impedance element IM1 and the second impedance element IM2 to the input/output end io1 are switched with the use of the switch circuits SW1 and SW2, when a filter circuit or a matching circuit is formed by connecting the first impedance element IM1 to the input/output end io1, the input/output end io1 is then, as is shown in FIG. 18(b), opened at the signal path terminal at the end where it is connected to the switch circuit SW2, which gives rise to a discrepancy between the circuits and a reflection wave may possibly be generated. This, in some cases, may give an adverse effect to a main signal. However, as is shown in FIG. 18(a), by inserting the switch circuit SW3 between the switch circuits SW1 and SW2 and the input/output end io1, the input/output end io1 and both of the signal path terminals are all connected to either one of the switch circuits SW1 through SW3. This prevents the signal path from being opened, and therefore, it is possible to avoid an adverse effect from a reflection wave induced when the signal path is in an open state.

For the placement of the switches, it is preferable that the distance between the switches is as close as possible. In particular, it is preferable that the distance is $\frac{1}{10}$ or less of the signal's wavelength in terms of the characteristic. This configuration is more effective in suppressing the adverse effect of the reflection wave to the characteristic.

Figure 19:
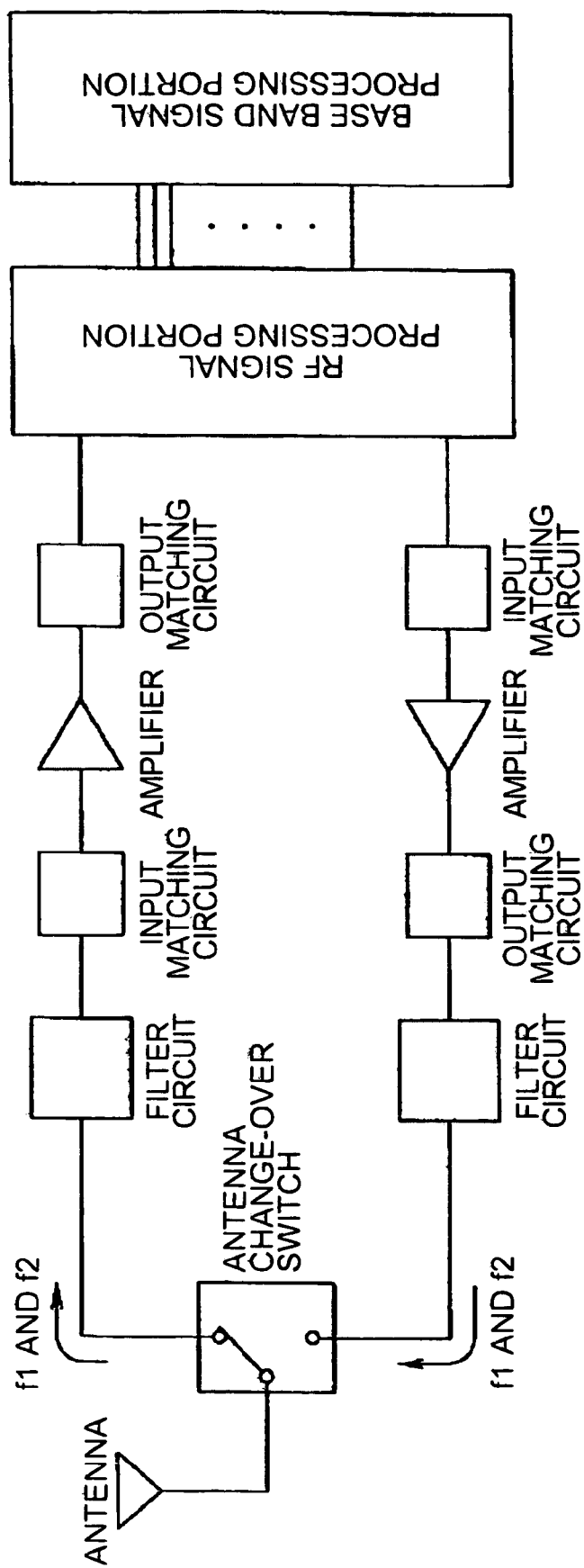
FIG. 19 shows one example of the configuration of a front end portion in a wireless communications device using the impedance circuit of the invention.

Also, each of the embodiments above described a case where the filter circuit or the matching circuit is used in a wireless LAN system. It should be appreciated, however, that the invention is not limited to this specific case. As is shown in FIG. 19, applications of the invention are not limited to a high frequency circuit or a wireless circuit, and the invention can be applied also to any device or circuit that performs processing using a filter circuit or a matching circuit, such as a wireless communications device and an electronic component. Moreover, the invention can reduce such a device or circuit size, and the invention is particularly effective for a device or a circuit that performs processing by switching over frequencies in plural bands.

Figure 20:
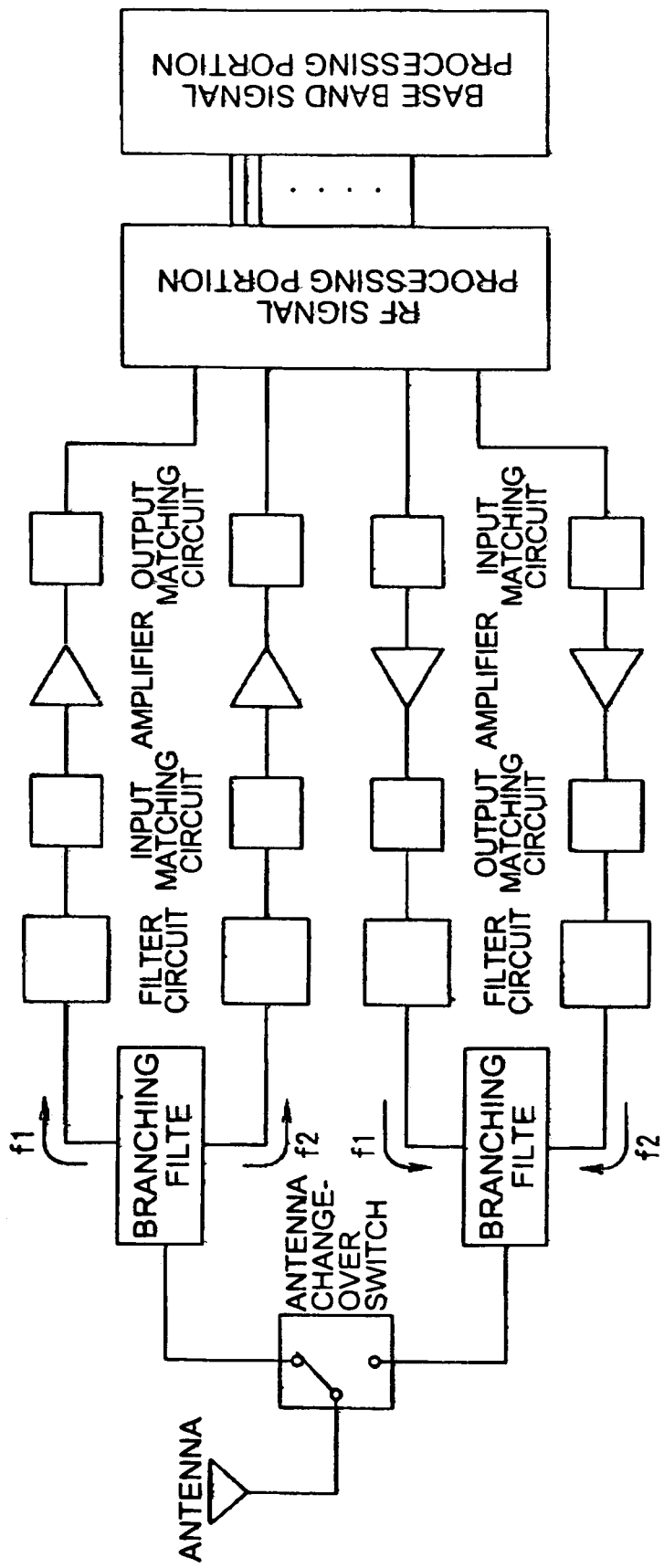
FIG. 20 is a view showing the configuration of a front-end portion in a conventional wireless communications device using more than one frequency.
Figure 21:
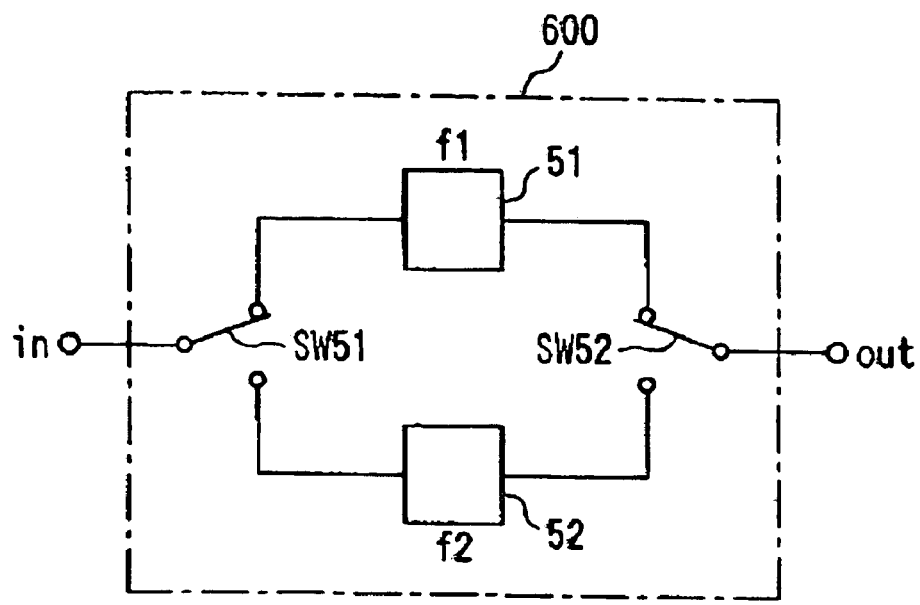
FIG. 21 shows one example of a conventional filter circuit.
Figure 22:
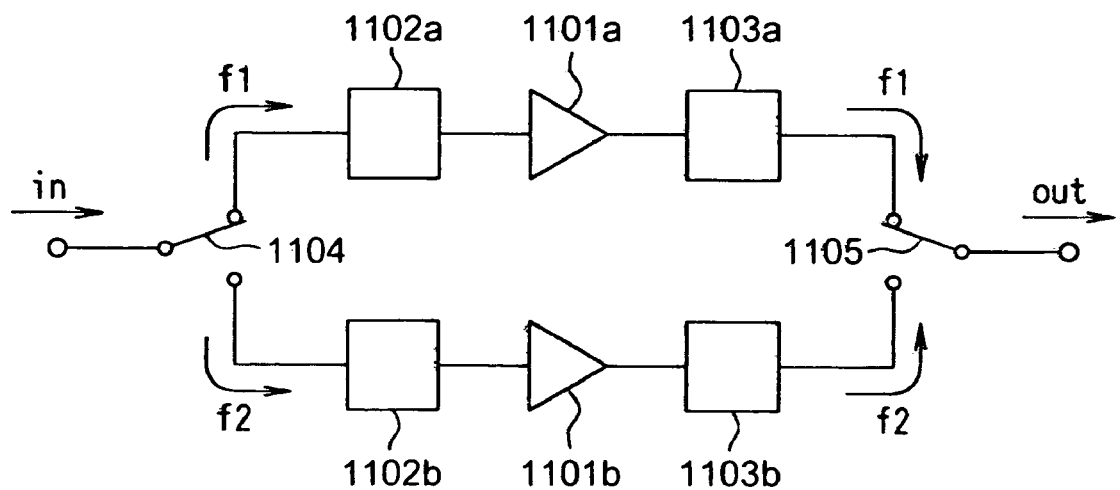
FIG. 22 is a view showing the configuration of amplifying elements provided with conventional matching circuits.

FIG. 19 is a view schematically showing the configuration when the invention is applied to a front-end portion of a wireless communications device. For a configuration that enables the reception of a lower-frequency signal f1 and a higher-frequency signal f2, each having a different frequency, as is shown in FIG. 20, it is necessary for the conventional method to provide a corresponding filter circuit or matching circuit for each signal, which complicates the circuitry. However, by using the filter circuit or the matching circuit of the embodiments above, as is shown in FIG. 19, the number of the components can be reduced.

What is claimed is:

1. An impedance circuit, comprising:
    a first impedance element having at least one inductor;
    a second impedance element having at least one capacitor;
    a first switch and a second switch; and
    a first terminal and a second terminal used to establish an outside connection, wherein:
    one end of said first impedance element and one end of said second impedance element are connected to said first terminal;
    the other end of said first impedance element is connected to said first switch;
    the other end of said second impedance element is connected to said second switch;
    one of said first switch and said second switch is connected to said second terminal and the other is connected to ground;
    said first switch and said second switch perform said switching with a semiconductor active element; and
    when one of said first and second switches is connected to said second terminal and is not connected to ground, the other of said first and second switches is connected to ground and is not connected to said second terminal.

2. An impedance circuit comprising:
    a first impedance element having at least one inductor;
    a second impedance element having at least one capacitor;
    a first switch and second switch;
    a first terminal and a second terminal used to establish an outside connection; and
    a filter having a band-pass characteristic and cascade-connected to one of:
    a connection end of said first impedance element and said second impedance element; or
    an end of said first switch and said second switch, wherein:
    one end of said first impedance element and one end of said second impedance element are connected to said first terminal;
    the other end of said first impedance element is connected to said first switch;
    the other end of said second impedance element is connected to said second switch;
    one of said first switch and said second switch is connected to said second terminal and the other is connected to ground;
    said impedance circuit forms a filter circuit; and
    when one of said first and second switches is connected to said second terminal and is not connected to ground, the other of said first and second switches is connected to ground and is not connected to said second terminal.

3. A filter circuit, comprising:
    first and second impedance circuits, each comprising:
    a first impedance element having at least one inductor;
    a second impedance element having at least one capacitor;
    a first switch and a second switch; and
    a first terminal and a second terminal used to establish an outside connection, wherein:
    one end of said first impedance element and one end of said second impedance element are connected to said first terminal;
    the other end of said first impedance element is connected to said first switch;
    the other end of said second impedance element is connected to said second switch;
    one of said first switch and said second switch is connected to said second terminal and the other is connected to ground;
    said impedance circuit forms a filter circuit, and wherein the first and second impedance circuits are cascade-connected; and
    when one of said first and second switches is connected to said second terminal and is not connected to ground, the other of said first and second switches is connected to ground and is not connected to said second terminal.

4. An impedance circuit comprising:
    a first impedance element having at least one inductor;
    a second impedance element having at least one capacitor;
    a first switch and a second switch; and
    a first terminal and a second terminal used to establish an outside connection, wherein:
    one end of said first impedance element and one end of said second impedance element are connected to said first terminal;
    the other end of said first impedance element is connected to said first switch;
    the other end of said second impedance element is connected to said second switch;
    one of said first switch and said second switch is connected to said second terminal and the other is connected to ground;
    at least one of said inductor and said capacitor comprises a distributed element; and
    when one of said first and second switches is connected to said second terminal and is not connected to ground, the other of said first and second switches is connected to ground and is not connected to said second terminal.

5. The impedance circuit according to claim 4, wherein:
    said first switch and said second switch are configured to switch connected-ends of said first impedance element and said second impedance element depending on a frequency of an input signal.

6. The impedance circuit according to claim 4, wherein:
    said first switch and said second switch perform said switching with a mechanical switch.

7. A semiconductor integrated circuit, wherein:
    an amplifier circuit and at least one switch, which is included in said impedance circuit according to claim 4 that forms a matching circuit for said amplifier circuit, are formed integrally on a common substrate.

8. An electronic component including said semiconductor integrated circuit according to claim 7.

9. A wireless communications device including said semiconductor integrated circuit according to claim 7.

10. The impedance circuit according to claim 4, wherein:
    said impedance circuit forms a matching circuit.

11. The impedance circuit according to claim 10, wherein:
    a circuit to be matched, said first switch, and said second switch are formed on a common substrate.

12. An amplifier circuit, provided with said impedance circuit according to claim 10 at least at one of an input end and an output end.

13. The impedance circuit according to claim 4, wherein:
    each of said first impedance element and said second impedance element comprises a lumped element.

* * * * *